United States Patent
Dayel et al.

(10) Patent No.: US 11,509,275 B2
(45) Date of Patent: Nov. 22, 2022

(54) METHOD AND APPARATUS FOR BIAS CONTROL WITH A LARGE DYNAMIC RANGE FOR MACH-ZEHNDER MODULATORS

(71) Applicant: NeoPhotonics Corporation, San Jose, CA (US)

(72) Inventors: Mark J. Dayel, Mountain View, CA (US); Wen-Jr Jiang, San Jose, CA (US); Jianying Zhou, Acton, MA (US)

(73) Assignee: NeoPhotonics Corporation, San Jose, CA (US)

( * ) Notice: Subject to any disclaimer, the term of this patent is extended or adjusted under 35 U.S.C. 154(b) by 517 days.

(21) Appl. No.: 16/389,295

(22) Filed: Apr. 19, 2019

(65) Prior Publication Data
US 2019/0324298 A1    Oct. 24, 2019

Related U.S. Application Data

(60) Provisional application No. 62/660,491, filed on Apr. 20, 2018.

(51) Int. Cl.
*H03G 3/30* (2006.01)
*G02F 1/01* (2006.01)
(Continued)

(52) U.S. Cl.
CPC ......... *H03G 3/3084* (2013.01); *G02F 1/0121* (2013.01); *G02F 1/0123* (2013.01);
(Continued)

(58) Field of Classification Search
CPC .. H03F 3/45475; G02F 1/212; H03G 2201/40
See application file for complete search history.

(56) References Cited

U.S. PATENT DOCUMENTS 6,175,320 B1 *   1/2001   Heflinger .................. G02F 7/00
                                                      341/131
6,396,605 B1 *   5/2002   Heflinger ............... H04B 10/60
                                                      398/140
(Continued)

OTHER PUBLICATIONS

Xiaolei Li, Lei Deng, Xiaoman Chen, Mengfan Cheng, Songnian Fu, Ming Tang, and Deming Liu, "Modulation-format-free and automatic bias control for optical IQ modulators based on dither-correlation detection," Opt. Express 25, 9333-9345 (2017) (Year: 2017).*

(Continued)

*Primary Examiner* — Peter Radkowski
(74) *Attorney, Agent, or Firm* — Christensen, Fonder, Dardi & Herbert PLLC; Peder M. Jacobson; Peter S. Dardi

(57) ABSTRACT

Improved dither detection, measurement, and voltage bias adjustments for an electro-optical modulator are described. The electro-optical modulator generally includes RF electrodes and phase heaters interfaced with semi-conductor waveguides on the arms of Mach-Zehnder interferometers, where a processor is connected to output a bias tuning voltage to the electro-optical modulator for controlling optical modulation. A variable gain amplifier (VGA) can be configured with AC coupling connected to receive a signal from a transimpedance amplifier (TIA) that is configured to amply a photodetector signal from an optical tap that is used to measure an optical signal with a dither signal. The analog to digital converter (ADC) can be connected to receive output from the VGA. The processor can be connected to receive the signal from the ADC and to output the bias tuning voltage based on evaluation of the signal from the tap.

11 Claims, 16 Drawing Sheets

(51) Int. Cl.
*H03F 3/45* (2006.01)
*G02F 1/225* (2006.01)
*G02F 1/21* (2006.01)

(52) U.S. Cl.
CPC .......... *G02F 1/0147* (2013.01); *G02F 1/2255* (2013.01); *G02F 1/2257* (2013.01); *H03F 3/45475* (2013.01); *G02F 1/212* (2021.01); *G02F 2203/50* (2013.01); *H03G 2201/103* (2013.01)

(56) References Cited

U.S. PATENT DOCUMENTS

| | | | | |
|---|---|---|---|---|
| 6,469,817 | B1 * | 10/2002 | Heflinger | G02F 1/0123 398/202 |
| 6,473,182 | B1 * | 10/2002 | Tazartes | H03G 3/3084 250/214 AG |
| 7,197,243 | B1 * | 3/2007 | Harley | H04B 10/077 398/193 |
| 7,369,290 | B1 | 5/2008 | Cox et al. | |
| 7,398,023 | B2 * | 7/2008 | Mazurczyk | H04B 10/505 372/32 |
| 7,715,732 | B2 | 5/2010 | Koh et al. | |
| 9,020,361 | B2 | 4/2015 | Kawakami et al. | |
| 9,059,805 | B2 | 6/2015 | Mak et al. | |
| 9,116,368 | B2 | 8/2015 | Kawakami et al. | |
| 9,692,518 | B2 * | 6/2017 | Bhandare | H04B 10/5053 |
| 2002/0186378 | A1 * | 12/2002 | Tazartes | H03G 3/3084 356/464 |
| 2004/0056718 | A1 * | 3/2004 | Nicklasson | H03G 1/0029 330/254 |
| 2006/0057993 | A1 * | 3/2006 | Bristow | H03C 3/40 455/260 |
| 2006/0078337 | A1 * | 4/2006 | Harley | H04B 10/077 398/186 |
| 2006/0127103 | A1 * | 6/2006 | Mazurczyk | H04B 10/5051 398/188 |
| 2008/0094123 | A1 * | 4/2008 | Koh | G02F 1/0123 327/513 |
| 2012/0155865 | A1 * | 6/2012 | Kawakami | H04B 10/50575 398/43 |
| 2013/0058439 | A1 * | 3/2013 | Lin | H03M 1/186 375/340 |
| 2014/0153077 | A1 * | 6/2014 | Kawakami | H04L 27/364 359/259 |
| 2014/0308047 | A1 * | 10/2014 | Mak | H04B 10/50577 398/182 |
| 2015/0002178 | A1 * | 1/2015 | Herb | G01N 27/028 324/693 |
| 2015/0244468 | A1 | 8/2015 | Mak et al. | |
| 2015/0256266 | A1 * | 9/2015 | Duthel | H04B 10/616 398/38 |
| 2017/0019172 | A1 * | 1/2017 | Yang | H04B 10/07951 |
| 2018/0267340 | A1 * | 9/2018 | Rohde | H04B 10/5561 |

OTHER PUBLICATIONS

Nicholas C. Harris, Yangjin Ma, Jacob Mower, Tom Baehr-Jones, Dirk Englund, Michael Hochberg, and Christophe Galland, "Efficient, compact and low loss thermo-optic phase shifter in silicon," Opt. Express 22, 10487-10493 (2014) (Year: 2014).*

Orozco, Luis, Programmable-Gain Transimpedance Amplifiers Maximize Dynamic Range in Spectroscopy Systems, Analog Dialogue 47-05, May 2013, www.analog.com/analogdialogue (Year: 2013).*

Sierbert, Loren, Use in-the-loop gain control to extend dynamic range, EE Times, Sep. 24, 2007 (Year: 2007).*

Mohammad et al., "Modulator Bias and Optical Power Control of Optical Complex E-Field Modulators." Journal of Lightwave Technology, 29 (15), IEEE: 2235-48, (Aug. 1, 2011).

* cited by examiner

METHOD AND APPARATUS FOR BIAS CONTROL WITH A LARGE DYNAMIC RANGE FOR MACH-ZEHNDER MODULATORS

CROSS REFERENCE TO RELATED APPLICATIONS

This application claims priority to U.S. provisional patent application 62/660,491 filed Apr. 20, 2018 to Dayel et al., entitled "Method and Apparatus for Bias Control With a Large Dynamic Range for Mach-Zehnder Modulators," incorporated herein by reference.

FIELD OF THE INVENTION

The invention relates to voltage bias adjustments for electro-optical modulators for optical telecommunication transmitters, which can involve the use of a dither signal(s) that are applied and measured to evaluate the voltage adjustment. The invention further relates to hardware and corresponding software for improved bias adjustment.

BACKGROUND OF THE INVENTION

A traveling wave structure is widely used in high speed linear modulators with Mach-Zehnder modulator (MZM) structures. An MZM modulator is formed by splitting input optical waveguide into two optical waveguide arms that operate as phase shifters due to electro-optic coupling, which are then combined to form a combined interference signal based on the Mach-Zehnder interferometer structure. By modulating phases on phase shifters, the optical phase and amplitude modulations can be achieved. Under a reverse bias condition, a P-N junction depletes carrier and causes a change in refractive index and the phase change as light propagates through the waveguide with the refractive index change. In traveling wave structure based modulators, a phase shifter has overlapped RF and optical waveguides, which can realize electrical-to-optical (E-O) conversion, characterized as phase change (degree) on optical wave propagated along the phase shifter per unit voltage applied to phase shifter. This structure is attractive for high speed linear modulators.

SUMMARY OF THE INVENTION

In a first aspect, the invention pertains to a dither detection system for an electro-optical modulator, in which the dither detection system comprises a variable gain amplifier, an analog to digital converter and a digital processor. The variable gain amplifier (VGA) can be configured with AC coupling connected to receive a signal from a transimpedance amplifier (TIA) that is configured to amply the photodetector signal from an optical tap that is used to measure an optical signal with a dither signal. The analog to digital converter (ADC) can be connected to receive output from the VGA. The processor can be connected to receive the signal from the ADC and to output a bias tuning voltage based on evaluation of the signal from the tap.

In further aspects, the invention pertains to a method for measuring a dither signal applied to an electro-optical modulator, in which the method comprises adjusting the gain of a variable gain amplifier to maintain the input to an analog-to-digital converter below full scale, wherein the variable gain amplifier is configured to receive an AC signal following conversion of a detector signal from an optical tap on a Mach-Zehnder component of the electro-optical modulator to a voltage signal by a transimpediance amplifier and blockage of the DC component of the voltage signal.

In another aspect, the invention pertains to a method for performing a voltage bias adjustment for an electro-optical modulator comprising RF electrodes interfaced with semiconductor waveguides on the arms of Mach-Zehnder interferometers, in which the method comprises applying the voltage bias, wherein the voltage bias is determined by integrating the time derivative voltage bias as a function of time being proportional to a sum of the product of unscaled dither values times the mean bias intensity. The sum can run over points based on the frequency of the analog-to-digital converter used to measure the dither signal and the frequency of the dither signal. In some embodiments, applying the voltage bias comprises sending current to a resistive heater interfaced with one of the semiconductor waveguides.

In other aspects, the invention pertains to method of dynamic gain adjustments to a variable gain amplifier for reducing beat signal resolution bias during automatic bias search and automatic bias control operations, where the variable gain amplifier is configured to receive an AC signal following conversion of a detector signal from an optical tap on a Mach-Zehnder component of the electro-optical modulator to a voltage signal by a transimpediance amplifier and blockage of the DC component of the voltage signal, in which the method comprises the following steps:

setting an initial gain for the variable gain amplifier based on a calibrated initial value and initiating an automatic bias search operation, wherein the calibrated initial value is set such that a maximum variable gain amplifier output is a selected fraction below an analog-to-digital-converter full scale monitor first order signal;

increasing the initial gain to keep an analog-to-digital-converter input of a first order dither signal at from about 0.45 to about 0.55 times the full scale monitor first order signal;

monitoring the first order dither signal until the initial gain of the variable gain amplifier reaches the calibrated maximum variable gain amplifier output; and maintaining the maximum variable gain amplifier output through a subsequent automatic bias control operation to have a lowest beat signal that reaches a resolution requirement of the analog-to-digital-converter.

Moreover, the invention pertains to a computer program product for dynamic gain adjustments to a variable gain amplifier for reducing beat signal resolution bias during automatic bias search and automatic bias control operations, where the variable gain amplifier is configured to receive an AC signal following conversion of a detector signal from an optical tap on a Mach-Zehnder component of the electro-optical modulator to a voltage signal by a transimpediance amplifier and blockage of the DC component of the voltage signal, the computer program product comprising:

a computer readable storage medium having program instructions embodied therewith, wherein the computer readable storage medium is not a transitory signal, the program instructions executable by a processor, the program instructions comprising:

instruction means to calibrate a variable gain amplifier to have a maximum variable gain amplifier output below an analog-to-digital-converter full scale monitor first order signal;

instruction means to calibrate a maximum gain of the variable gain amplifier to have a minimum beat signal that reaches a resolution requirement of the analog-to-digital-converter;

instruction means to set an initial gain for the variable gain amplifier based on the calibrated value and initiating an automatic bias search operation;

instruction means to increase the initial gain to keep an analog-to-digital-converter input of a first order dither signal at 0.5 times the full scale monitor first order signal;

instruction means to monitor the first order dither signal until the initial gain of the variable gain amplifier reaches the calibrated maximum variable gain amplifier output; and instruction means to maintain the maximum variable gain amplifier output through a subsequent automatic bias control operation.

In addition, the invention pertains to a method for applying a superimposed reference signal to an RF electrode within an electro-optical modulator comprising semiconductor waveguides in a Mach-Zehnder configuration, in which the method comprises applying two oscillating voltages added to a signal modulation, each oscillating voltage being applied according to the formula, $f_\alpha(\varphi)=(1-)1-\sin(\varphi))^\alpha)^\wedge(-1+(1-\sin(\varphi+\pi))^\alpha)$, where $\alpha$ is a parameter controlling the anharmonic character with $\alpha \geq 1.1$.

In some aspects of the invention, the following processing is introduced:

a method for maintaining the correct bias point, by using the combined signal from both f1−f2 and f1+f2, which improves the SNR by 3 dB over either alone a method of calibration of optimal signal recovery of f1+f2 and f1−f2 which accounts for system imperfections (e.g. differential phase delay of f1, f2, f1+f2 and f1−f2 signals introduced by TIA electronics, phase heaters etc.)

a method of efficiently implementing this control loop which achieves minimal CPU overhead and preserves signal during heavy load conditions a method of scaling dither voltage amplitude for heater phase control a method of compensating crosstalk between bias control channels a method of recognizing closest quadrature point

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
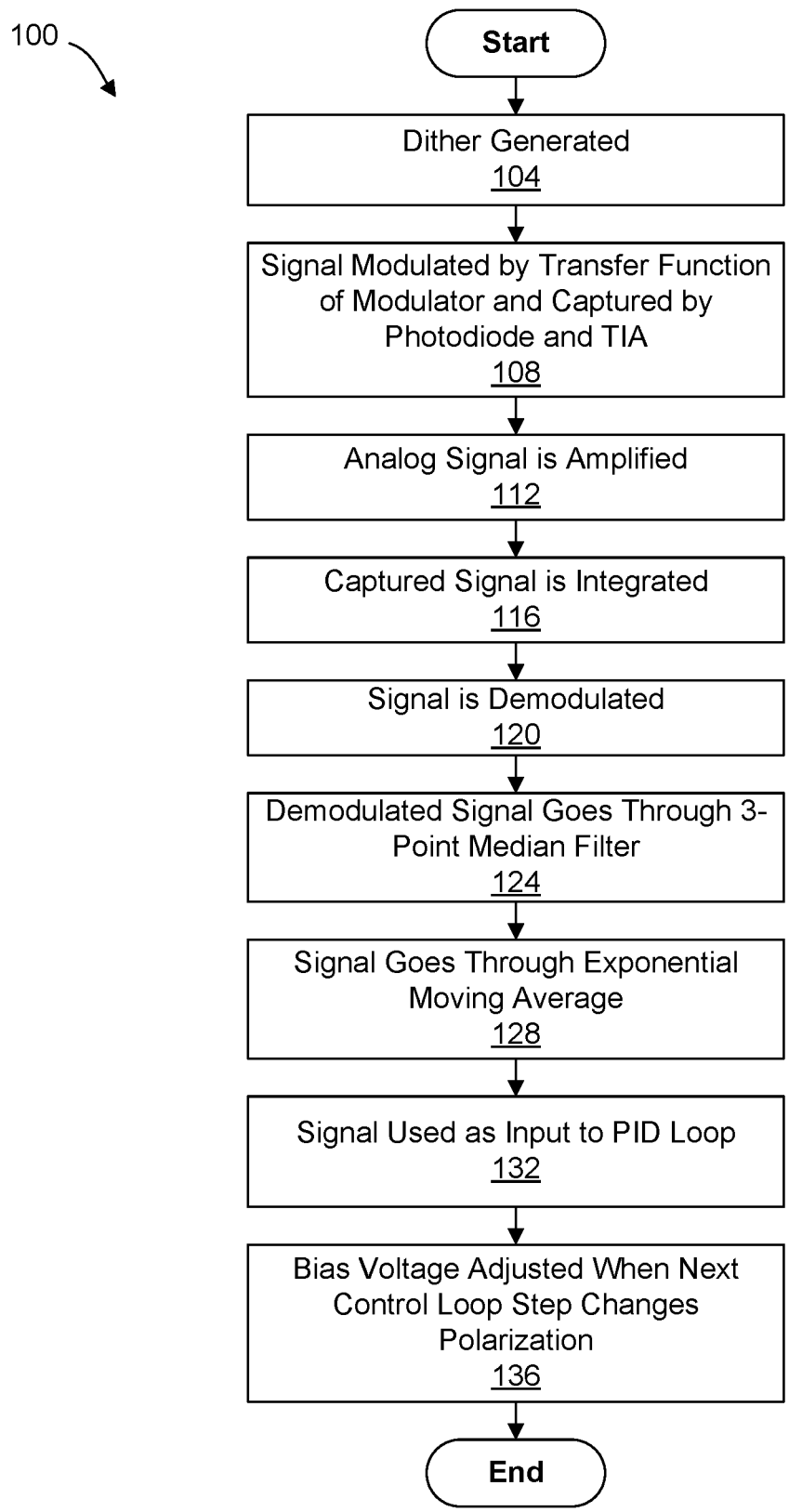
FIG. 1 depicts a flow chart of the general process of adjustment of the bias voltage based on a dither signal processing, according to one or more embodiments.

While the embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION OF THE INVENTION

Desirable approaches are described herein to provide for maintenance of voltage bias in electro-optical modulators that operate at high data transmission rates. The voltage bias adjustment provides for maintenance of a high signal to noise ratio. To evaluate the voltage bias, a dither signal is generally applied along with the signal itself, and the measurement of the dither signal at an optical tap at the output of the modulator provides for a determination of a voltage bias adjustment. An improved approach for measurement of the dither signal is described in which a variably adjustable amplifier is combined with a DC blocker to bring the signal to an analog to digital converter within a desirable range to allow for a more accurate measurement of the dither signal with particular analog to digital converter and digital processor. Also, improved dither signal production and analysis provides for further improvement in the voltage bias correction.

Mach-Zehnder (MZ) interferometers are used in electro-optic modulators to encode data onto coherent laser light for transmission over optical fibers. Data is encoded by rapid adjustment of the relative phase of the MZ interferometer arms, but this rapid phase adjustment centers around a carefully controlled phase offset (bias point), and this bias point is affected by factors such as temperature and the data signal being transmitted. Due to effects on the bias point, the bias point should receive dynamic adjustment while the modulator is transmitting data to keep signal-to-noise within desired ranges. Correct maintenance of this bias point is increasingly important as modern data transmission moves to higher order QAM signals. Typically the bias point is maintained by imposing a dither, which monitors the response of the system as the bias point is first moved one way then the other, and adjusts the bias point based on decoding the system response to these adjustments. The larger the amplitude of this dither signal, the better the correct bias point can be found (because the signal is larger), but the dither itself moves the bias point away from its optimal point. The challenge is therefore to accurately maintain the correct bias point while minimizing the dither amplitude.

Modulators for coherent optical signal transmission typically consist of six nested MZ interferometers: two child MZs (I and Q) and one parent MZ (P) for each of two polarizations (X and Y), and a typical bias scheme sets the child MZs to their null point, and the parents to quadrature, based on the QAM signal processing. By dithering pairs of MZs simultaneously (e.g. XI and XQ) at two frequencies (f1 and f2), and reducing the recovered beat signal between the two (e.g. f1−f2 or f1+f2) the desired bias point can be found and maintained. This process is described in the context of different dither generation and evaluation by Sotoodeh et al. (hereinafter Sotoodeh), "Modulator Bias and Optical Power Control of Optical Complex E-Field Modulators, Journal of Lightwave Technology, Vol. 29 (15), 2235-2247 (2011), incorporated herein by reference.

In coherent transceivers, quadrature phase modulation (QPSK) with multiple MZMs (child and parent) are widely deployed in optical communication networks for high capacity and long fiber transmission without optical dispersion compensation. During operations, the modulators bias needs to operate at the required bias conditions, child MZM I and Q at Null bias and IQ parent MZM at quadrature bias. Auto bias control (ABC) are common used by adding dither signals to MZM bias and detected with tap monitor photo detector (mPD) followed by TIA and ADC. The detected first order signal can be used for child MZM control (I and Q) and the RF detector is used for parent (IQ) MZM.

In recent years, high order Quadrature amplitude and phase (QAM) are attractive to support multiple modulation format such as QPSK/8QAM/16QAM/64QAM and various spectral filters with the same transceivers and quadrature phase modulator for flexible optical network with different reach and spectral density requirement. However, such applications result in a large operating range for optical power at DC levels under modulations, which can impact dither detections. For example, the modulation loss for 64QAM with Nyquist filter and Pi phase modulator for linear operating can be as high as 14 dB, while the modulation loss for QPSK with Gaussian filter with 2×Pi phase modulation for max optical power operating requirement can be as low as 3.5 dB. As described herein, improved approaches are described for measuring the dither signals to allow for improvement of the voltage bias correction based on the dither signal.

The control loop generally uses the beat method to control child and parent MZs. The loop can be reconfigured using the python interface. Changing numeric values can be performed while the loop is running, but the loop is stopped before reconfiguring dithers. The general concepts of the control loop are outlined in the context of the following discussion of FIG. 1.

Referring to FIG. 1, a flow chart depicts the general process 100 of adjustment of the bias voltage based on a dither signal processing. In various embodiments, the process 100 comprises, at operation 104, generating a dither signal and, at operation 108, modulating the dither signal by a transfer function and capturing the dither signal using a photodiode and transimpedance amplifier (TIA). In various embodiments, the process 100 comprises, at operation 112, amplifying the analog signal and, at operation 116, integrating the captured dither signal.

In various embodiments, the process 100 comprises, at operation 120, demodulating the dither signal. In various embodiments, the process 100 comprises, at operation 124, propagating the demodulated signal through a 3-point median filter, digital filtering to decrease noise. In various embodiments, the process 100 comprises, at operation 128, propagating the demodulated signal through an exponential moving average. In various embodiments, the process 100 comprises, at operation 132, using the signal as an input to a PID loop (proportional integral derivative controller). In various embodiments, the process 100 comprises, at operation 136, adjusting bias voltage when next control loop step changes polarization.

As described herein, improved dither measurement is performed with a new hardware architecture that provides for DC filtering and/or analog amplification prior to analog-to-digital conversion (ADC). The DC filtering removes signal interfering with the bias correction based on the dither from the optical signal measurements, and the amplification provides form a more accurate ADC. Following the description of the improved dither measurement, improved approaches for dither generation and dither processing are described. The improved dither generation and dither processing may or may not take advantage of improved dither measurement, and correspondingly the improved dither measurement may or may not make use of the approaches for dither generation and dither processing as described herein. Of course, it may be particularly desirable to combine all or some of the improved approaches herein starting with the dither generation, dither measurement and dither processing to produce improved bias voltage adjustment.

In another aspect of the invention, the method and apparatus for modulator auto bias search (ABS) and auto bias control (ABC) for dither detections with a large dynamic range in both DC and AC detections. The disclosed method and apparatus describes hardware implementation and software algorithms to reduce or eliminate not only limitations of DC and AC dynamic ranges, but also the constraints of the resolutions and signal to noise ratio for dither signal detections for ABS and ABC.

Improved bias control can be implemented in the approaches described herein based on alternative dither evaluation, improved dither evaluation for feedback control, and/or through use of the bias evaluation for bias control. Through one or more of the approaches described herein, electro-optical modulator performance can be controlled to obtain reduced optical noise for high bandwidth operation.

The modulation of a Mach-Zehnder Interferometer (MZI) type optical modulator is described in U.S. Pat. No. 9,020,361B2 to Kawakami et al., entitled "Optical Signal Transmitter, and Bias Voltage Control Method," incorporated herein by reference. In relevant optical modulators, RF waveguides interface with optical semiconductor waveguides to perform the optical modulation. The electric fields applied to perform the modulation can be written as:

$$E_1 = 2 \times \cos(\Phi_1) \exp(i\omega_c \cdot t); \quad \text{(I-1)}$$

$$E_3 = 2 \times \cos(\Phi_2) \exp(i\omega_c \cdot t + i\theta_3). \quad \text{(I-2)}$$

where bias voltages are set for $\Phi_1$ and $\Phi_2$ to take on values of 0 or $\pi$ depending on the sign of the data. The output intensity can be expressed as the following:

$$|E_1 + E_3|^2 = 2 + \cos(2\Phi_1 + 2A_d f_{d1}(t)) + \cos(2\Phi_2 + 2A_d f_{d2}(t)) + 4\cos(\Phi_1 + A_d f_{d1}(t)) \times \cos \Phi_2 + A_d f_{d2}(t)) \times \cos(\theta_3). \quad \text{(I-3)}$$

The dither functions $f_{d1}$ and $f_{d2}$ can be sinusoidal or other functions and the dither amplitude $A_d$ provides the magnitude of the bias control, which can be adjusted based on bias measurements.

The dither based bias control involves detection of the bias control or dither and a feedback loop, generally using a tap to measure optical output and corresponding bias. Two approaches to perform this bias control are described that share some common features.

An approach for improved dither generation sis described that can be used for bias voltage evaluation, and this improved approach for dither generation may or may not be combined with other voltage bias calculation improvements described herein. In the improved dither generation approach, the MCU (microcontroller unit) generates two dithers (A and B). The generated dithers can be generated having a variety of different frequencies, however, in some specific embodiments, the MCU can generate dithers A and B where the dithers are pure tones of 5 kHz and 3.33 kHz and each point sent to the internal DACs (digital-to-analog converters) at a rate of 80 kHz. These frequencies are chosen so that the number of points in their periods have a reasonably low lowest common multiple (LCM). As such, for 80 kHz per point, the dither periods are 16 points and 24 points respectively, with an LCM of 48 points, where dithers A and B can be represented by the relationship:

$$a_n = \sin\left(\phi_a + \frac{2\pi n}{\tau_a}\right) \quad \text{(I-4)}$$

$$b_n = \sin\left(\phi_b + \frac{2\pi n}{\tau_b}\right)$$

where $\tau_a = 16$ and $\tau_b = 24$.

Based on these concepts, other similar pairs of pure dither tones can be correspondingly selected with appropriate numbers of points with this frequency of points or alternative frequency of points.

Figure 2A:
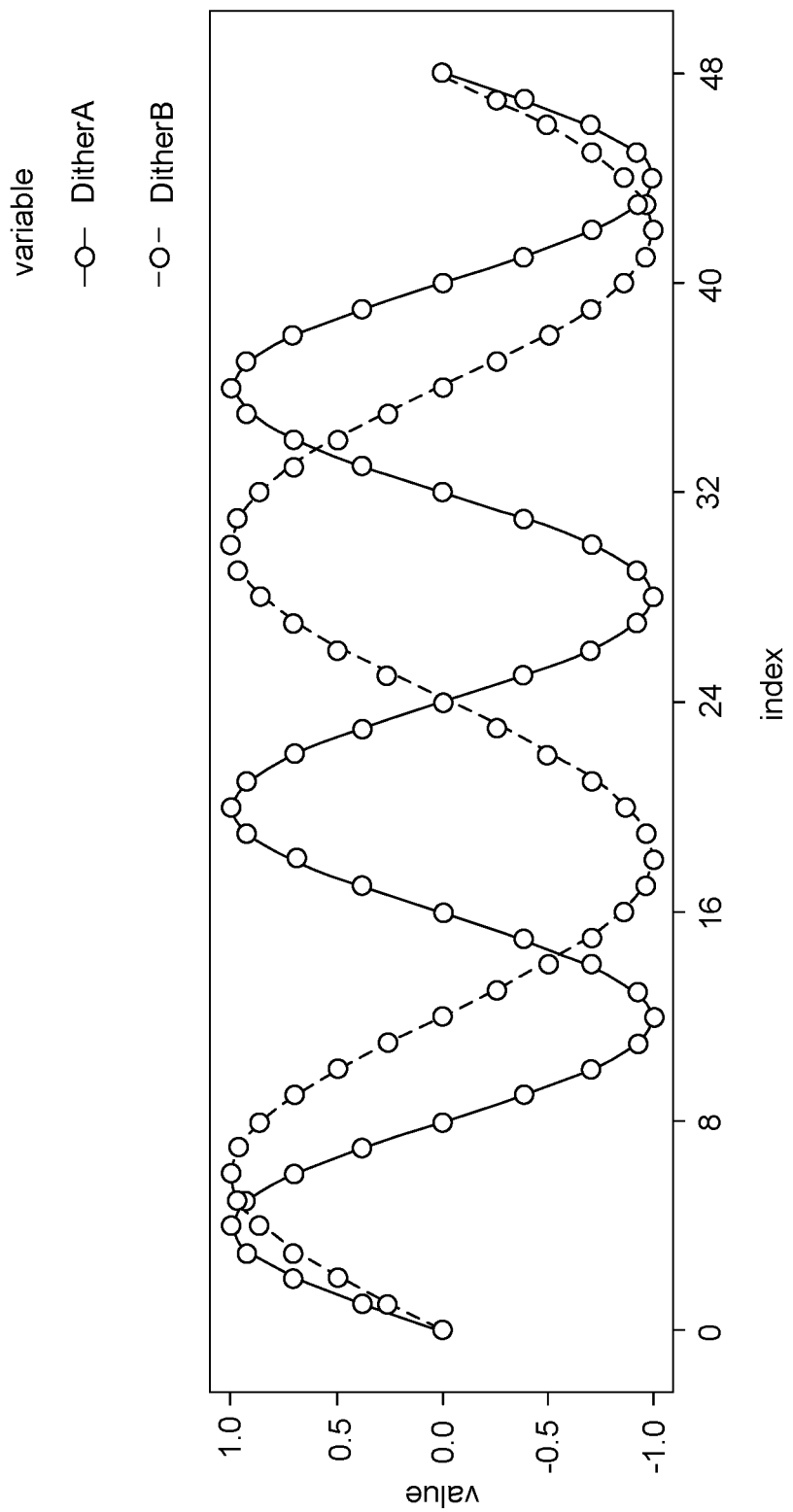
FIG. 2A is a plot for a pair of generated dither values, Dither A and Dither B, as a function of timing index points, according to one or more embodiments.
Figure 2B:
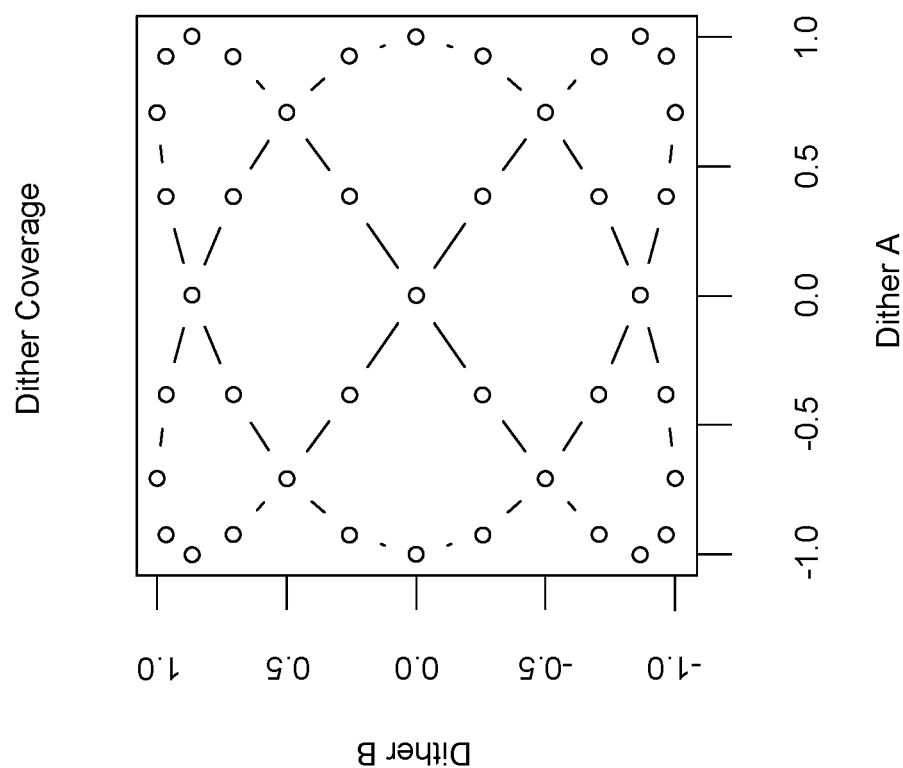
FIG. 2B is a plot of dither signal coverage for the pair of generated dithers, Dither A and Dither B, depicted in FIG. 2A, according to one or more embodiments.

Referring to FIG. 2A, this relationship for $a_n$ and $b_n$ for dithers A and B are depicted in a schematic diagram. By choosing even harmonics, the pattern repeats without discontinuity, and by choosing adjacent even harmonics above (e.g. the above are 4th and 6th harmonics of an 833 Hz fundamental), the entire pattern repeats every LCM (48) points. In various embodiments, the frequency for the generated dithers is chosen with the objective to evenly cover the 2 dimensional dither space. For example, referring to FIG. 2B, the 2-dimensional coverage of the dither space for dithers A and B is depicted. However, as seen in FIG. 2B, the points around the center control scheme are essentially wasted, since their distance from the center determines how much they contribute to the signal. As such, in certain embodiments, the dither signals can be made more square, for example by using the function below (which is a sin wave when $\alpha=1$, and becomes more square for increasing $\alpha$):

$$f(\phi,\alpha) = (\phi\%2\pi < \pi) \rightarrow (1-(1-\sin(\phi))^\alpha) \wedge (-1+(1-\sin(\phi+\pi))^\alpha) \quad \text{(I-5)}$$

Figure 2C:
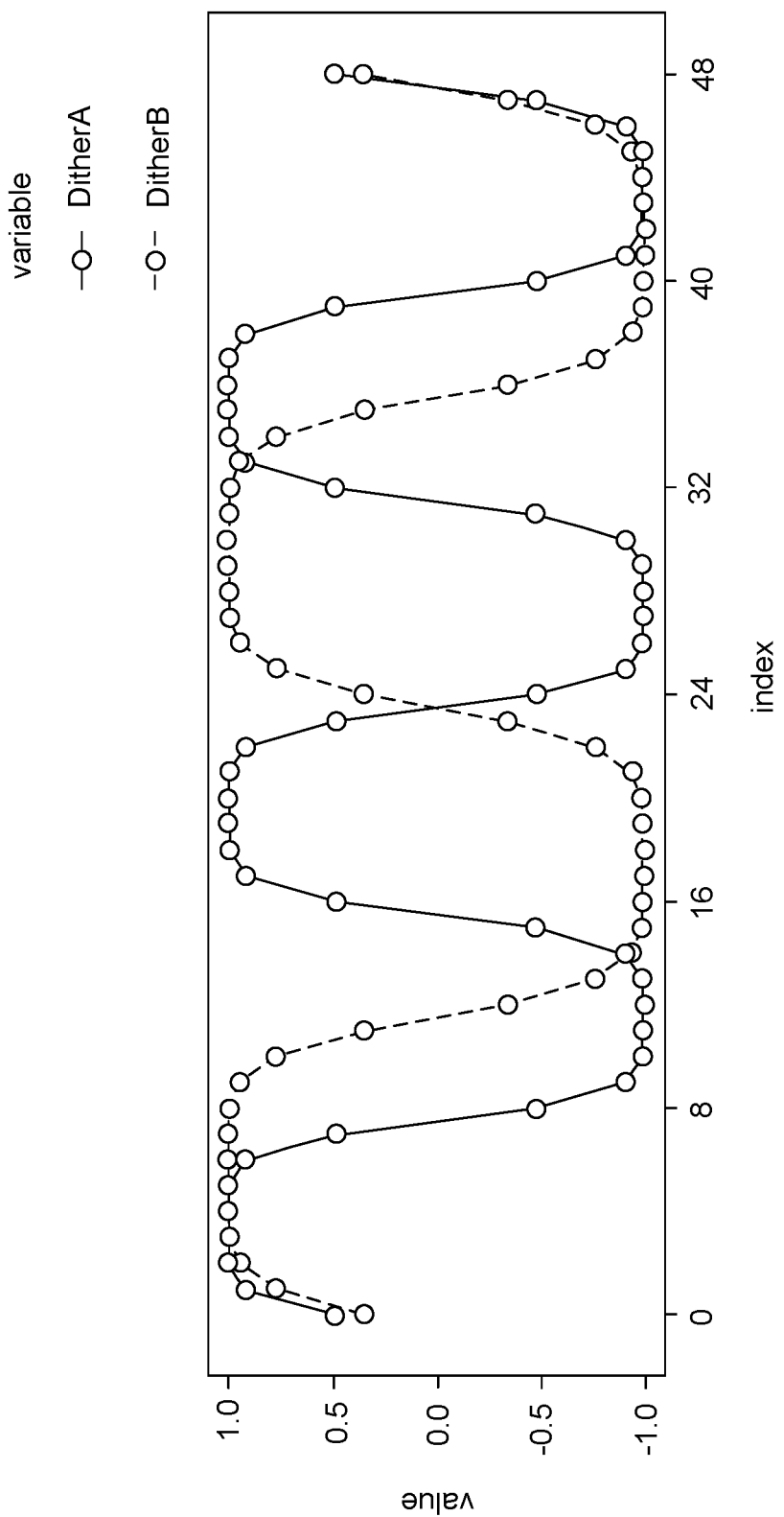
FIG. 2C is a plot for a pair of generated dither values, Dither A and Dither B, as a function of timing index points, according to one or more embodiments.
Figure 2D:
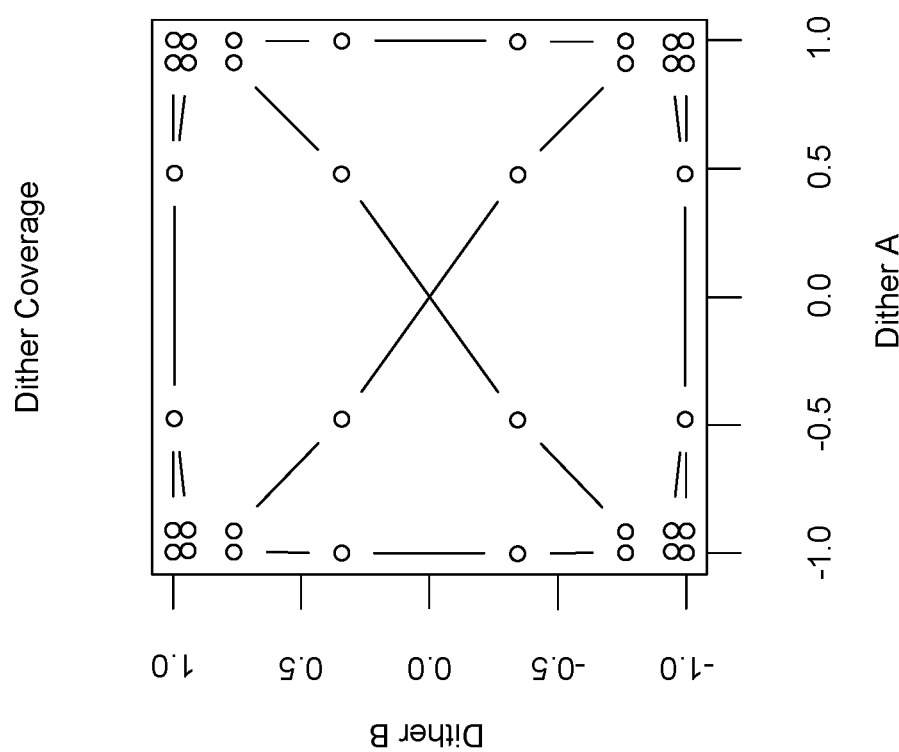
FIG. 2D is a plot of dither signal coverage for the pair of generated dither values, Dither A and Dither B, depicted in FIG. 2C, according to one or more embodiments.

Referring briefly to FIG. 2C, this function for dithers A and B are depicted in a schematic diagram. By making the dither function more square, and offsetting the phase by half the sampling period (in this case sampling is 80 kHz, so a 6.125 µs offset), more time is spent in the outer parts of the curve which produce signal, without increasing the maximum magnitude of the dither. E.g. for $\alpha=3$. In various embodiments the squareness of the wave is limited by the bandwidth of the phase driver (electronics and hardware, e.g. phase heaters will be slow), and detection (TIA). Referring briefly to FIG. 2D, the 2-dimensional coverage of the dither space for dithers A and B is depicted. As seen in FIG. 2D, the points around the center are reduced due to the squareness of the wave, meaning less points are wasted as compared with the waves generated in FIGS. 2A-2B. In some embodiments, $\alpha$ is greater than 1 and may be selected to provide a desired degree of squareness, such as values at least about 1.1, in further embodiments at least about 1.25, in other embodiment 1.5 to about 100, and in additional embodiments from about 1.6 to about 10. A person of ordinary skill in the art will recognize that additional ranges of alpha ($\alpha$) within the explicit ranges above are contemplated and are within the present disclosure.

In various embodiments, in a first approach for dither detection, the dither detection (ADC) is tightly phase locked to the dither generation, e.g. by the code for dither generation and detection running in the same interrupt routine. After amplification, the DC and AC components of the photodiode signal are separated by the electronics after the TIA. The AC component (with electronics gain adjustable under MCU control) is sampled by the ADC, and for each point of the cycle (i.e. 48 points for above dithers) ADC readings accumulate in a buffer, each point having a sum and count. In such embodiments, this provides for a number of benefits. For example, such embodiments, allow a mean for each point to be calculated at any time (no need to synchronize with interrupt), avoids the need to synchronize the averaging with the dither phase, and can involve reduced CPU resources (integer sums). Further, if the main CPU task is delayed for some reason, data simply continues to integrate in the buffer, improving signal to noise ratio (SNR). Typically each point will have >10 samples, which is adjustable according to SNR.

In one or more embodiments, in a particular approach, the dithers A and B, can then be routed to each of the modulator biases (e.g. Dither A to XI and Dither B to XQ). Dither amplitude is scaled by changing the range of the DAC outputs. When using heaters as phase control the output voltage to the heaters is scaled by the square root of the target phase shift (since phase is proportional to $I^2$). Changing the routing causes a glitch on the AC photodiode signal, so the first millisecond of ADC data can be discarded.

After data for a specified number of cycles is accumulated, the data for the cycle is transferred to one of 6 buffers (one per bias) and routing proceeds in sequence according to the beat method, see Sotoodeh, cited above:

| Bias.being.adjusted | Dither.A.routing | Dither.B.routing |
|---|---|---|
| XI | X | XQ |
| XQ | X | XI |
| X | XI | XQ |
| YI | Y | YQ |
| YQ | Y | YI |
| Y | YI | YQ |

Because our dither detection (ADC) is tightly phase locked to the dither generation (DAC), we are able to recover our error signal by simply multiplying each point of our buffer by a phase-locked reference signal. This provides better performance than, for example, using IIR (infinite impulse response) filters to recover the f1+f2 beat signal, as the phase is already known, and our reference signal can take account of f1+f2 and f1−f2.

The error signal is calculated for each of the 6 bias buffers by multiplying the mean intensity $I_{bias}$ with the product of the two unscaled dithers for each point (i.e. synchronous detection) and summing. For the beat, this is:

$$\sigma_{bias\_beat} = \Sigma_{n=1}^{48} a_n b_n I_{bias,n}, \quad (I\text{-}6)$$

And for the fundamental (assuming α is the modulation for bias):

$$\sigma_{bias\_fund} = \Sigma_{n=1}^{48} a_n I_{bias,n} \quad (I\text{-}7)$$

And this sum is used as the error signal for each of the 6 bias voltage adjustments:

$$\frac{dV_{bias}}{dt} = k_p \sigma_{bias} \quad (I\text{-}8)$$

where $k_p$ is a scaling constant.

Figure 3A:
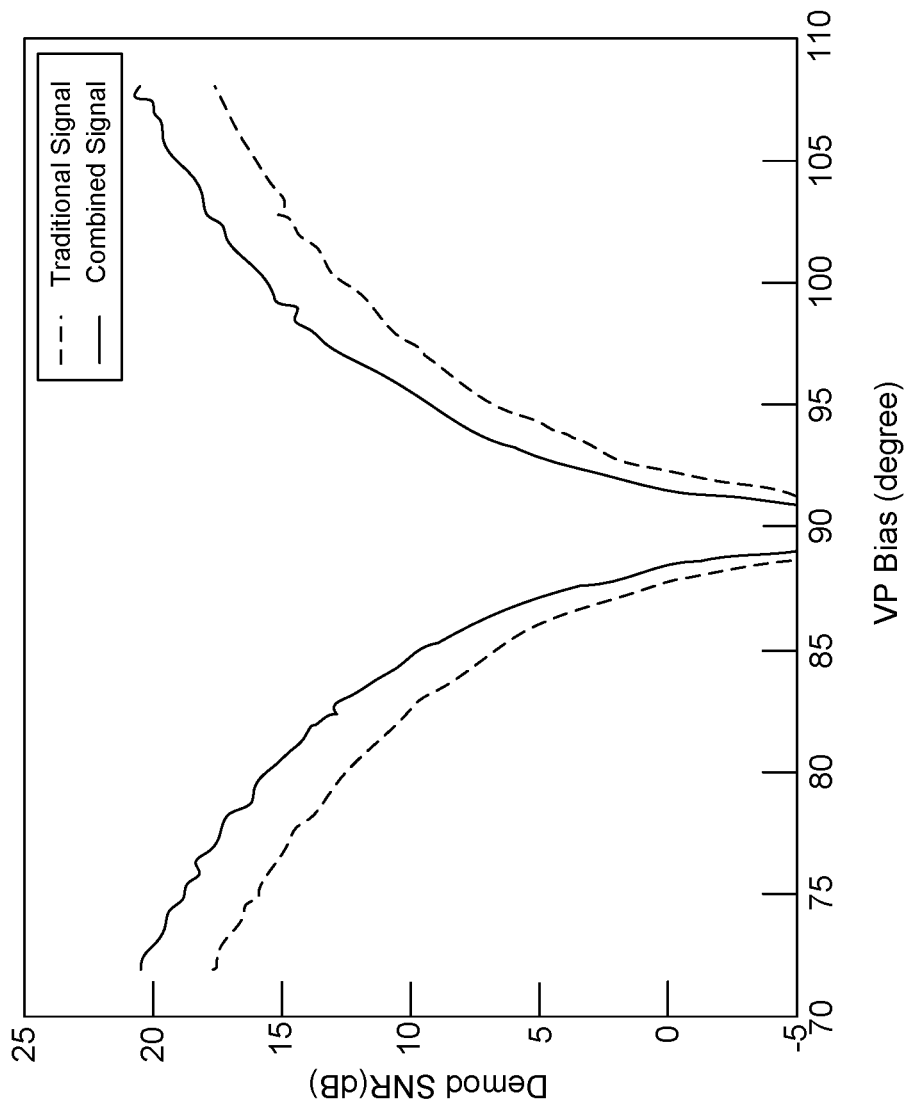
FIG. 3A is a plot of simulation results of demodulation signal-to-noise ratio (SNR) comparison between a traditional method and values obtained with a pair of combined dither signals, according to one or more embodiments.

Referring to FIG. 3A, a simulation result of the SNR comparison is depicted between traditional method that use either f1+f2 or f1−f2 and combined signal as described herein. The simulation result shows the SNR can be improve by 3 dB for any bias condition that can improve the stability of the control loop and reduce convergence time. Bias voltages can be updated after each polarization is complete, i.e., first the errors for XI, XQ and X are measured in sequence, then these voltages updated together, then YI, YQ, and Y are measured in sequence, then those voltages are updated together. The rationale for adjusting one polarization at a time is to allow the system to settle before taking the measurement, i.e. X polarization is settling while we are measuring Y, and vice versa.

Figure 3B:
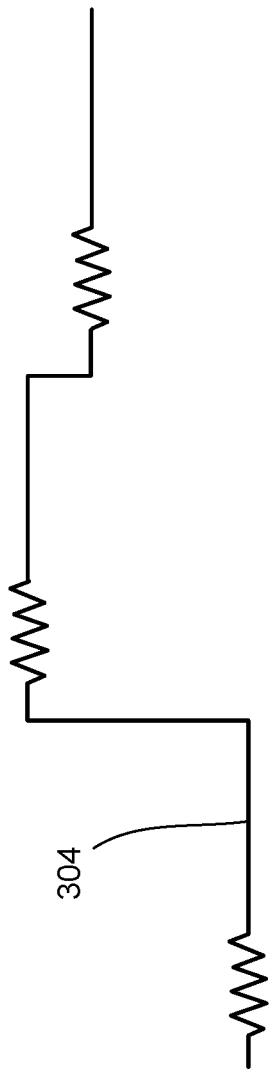
FIGS. 3B-3C depict the high low-cutoff frequency for the output of the TIA and the output of Amp are depicted, respectively, according to one or more embodiments.
Figure 3C:
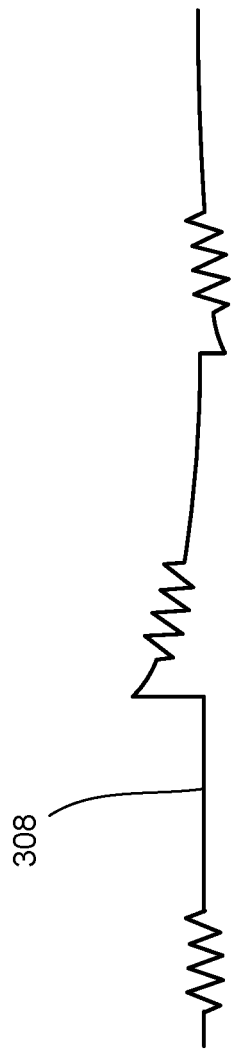

After adjusting the bias voltages, the change in DC intensity causes a jump in the high-gain AC amplifier, so a countdown blankout timer is set every time the bias voltages are significantly adjusted—integration of the signal is suspended while this counts down (this timing is hardware dependent, e.g. while the DC block capacitor charges). The filter has high low-cutoff frequency is needed in order to speed up the loop convert time. Referring to FIGS. 3B-3C, the high low-cutoff frequency for the output of the TIA and the output of Amp are depicted, respectively. As seen in FIGS. 3B-3C, the output 304 of the TIA presents a small AC signal as compared to DC, with a low frequency cut-off of the Amp output 308, as compared to the TIA output 304.

In various embodiments, a high resolution ADC (>20 bits) is needed for the Rx circuit. The design still needs 16 bits resolution ADC if the circuit use bandpass filter to reduce the power of fundamental signal. In certain embodiments, the modulator is capable of response to a variety of modulation formats and cover different loss from production variation. Therefore, >16 bits ADC is needed to meet future requirement.

With respect to loop initialization, the target of control loop is to reduce or effectively eliminate the demodulation signal. However, in some instances, the modulator bias condition may cause a small demodulation signal output. In such instances, this condition can cause the control loop to lock in the local minimize points or can cause a longer coverage time. In order to prevent this situation, various embodiments of the disclosure are able to present the correct information in any bias condition.

As an example of loop initialization, during operation, e.g. when I and Q are at null and P is at quad, the bias point can be maintained by directing dithers to I and Q only, and using the fundamentals as the error signal for the respective I and Q errors, and the beat as the error for the parent. This signal is dominated by the fundamentals for I and Q. We can recover the beat by shifting the parent position slightly positive, then slightly negative of the lock point and calculating the difference.

More importantly, this method (shifting the bias point one way then the other and measuring the difference) can be used to measure the true response of the system, and generate an optimal reference signal which not only compensates for phase delay, but compensates for differential phase delay between high and low frequency components (e.g. due to phase heater bandwidth, variable gain amplifier etc.) The current control scheme uses the beat method, disclosed and further discussed in Sotoodeh, Mohammad, Yves Beaulieu, James Harley, and Douglas L McGhan. 2011. "Modulator Bias and Optical Power Control of Optical Complex E-Field Modulators." *Journal of Lightwave Technology* 29 (15). IEEE: 2235-48, incorporated herein by reference. However, various embodiments apply at least the following modifications (each noted with *): * initial rapid search using beat is used to find the min/min/quad lock point for I/Q/P, using a larger dither amplitude, a lower gain, and a low integration time (large dither does not impact traffic at this stage, since we are not locked). * during this search, the we recognize the closest quadrature point for the parent by tracking the sign of $$\frac{dE_P}{d\phi_P},$$

and flip the sign of the parent gain term ($k_p$ above) if needed to lock to closest quad point. * Once target is reached (detected by combination of bias error signals and DC amplitude) loop switches to the fundamental method for I and Q adjustments (this improves SNR compared to beat method because 1) the fundamental signal for I and Q is much larger than the beat, and 2) only two loop steps are required, rather than 6, so the integration time can be 3× longer for each, improving SNR). This method would be vulnerable to locking to the max rather than null, except the initial use of the beat method puts us close to the target, forcing the null points to be chosen. * Finally, once settled, the number of integrations and averaging are increased, allowing increased robustness against noise.

Described further below, various embodiments are directed to a modulator with phase modulation controlled by heaters, not a voltage correction to the RF electrodes (i.e. phase modulation is linear with heater power (voltage squared)), which we can compensate for by transforming our target phase thus: $V=V_0+\sqrt{\alpha\phi}$. In addition, various embodiments are directed to a modulator capable of reducing crosstalk between the channels, mainly by the single-ended drive, but also by thermal crosstalk. To reduce the crosstalk, we compensate for the crosstalk by multiplying each of our channel phases by a matrix (i.e.

$$V_{XI} = V_0 + \sqrt{\begin{array}{c}\alpha_{XI\to XI}\phi_{XI} + \alpha_{XQ\to XI}\phi_{XQ} + \alpha_{XP\to XI}\phi_{XP} + \\ \alpha_{YI\to XI}\phi_{YI} + \alpha_{YQ\to XI}\phi_{YQ} + \alpha_{YP\to XI}\phi_{YP}\end{array}}, \quad (I-9)$$

and similarly for $V_{XQ}$ $V_{XP}$ etc.

In addition, the auto bias search (ABS) for operating bias condition is performed before MZM bias can be locked to the desired operating conditions for close loop with auto bias control (ABC). We define ABS as an operation to search operating bias conditions at initial bias setting until the biases converges to the desired operation range for ABC, while ABC is defined as an operation when the bias is locked within the desired accuracy range. During ABS, the maximum modulator output power with child I and Q and IQ parent at peaking bias conditions can be over 9 dB higher than the output power at operating bias conditions with child I and Q at null bias and IQ parent at quadrature for 64QAM modulation with Pi phase shift modulator. Thus, this further increases the operating range for optical output power at DC level during ABS operations.

Figure 4:
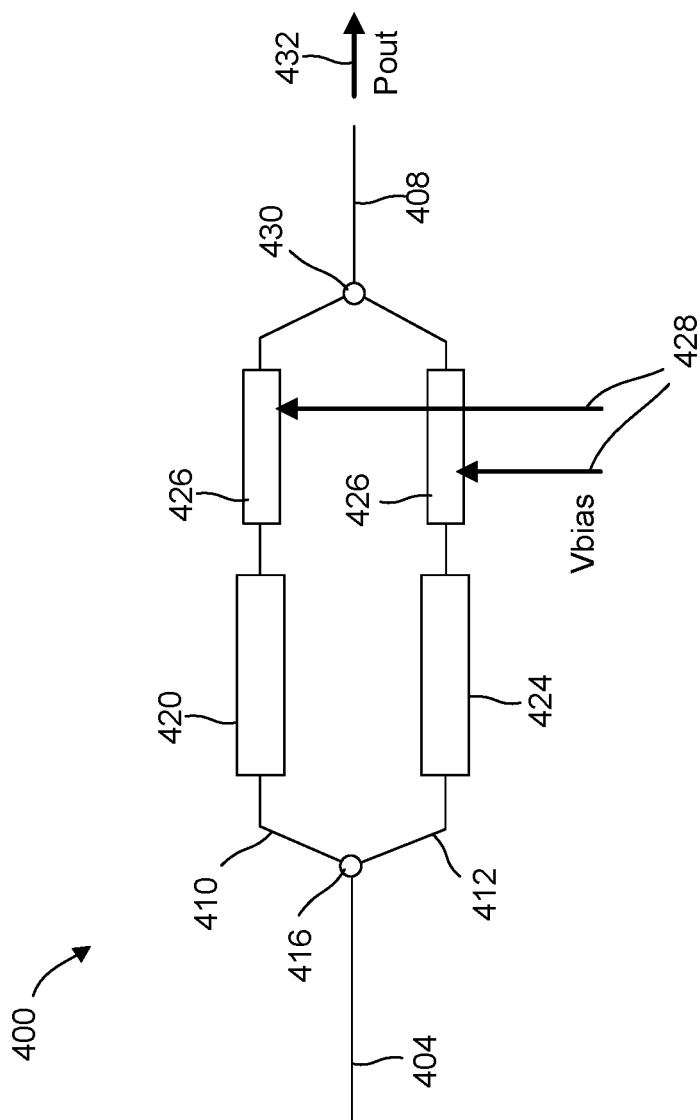
FIG. 4 depicts a schematic diagram of a MZM modulator element, according to one or more embodiments.

Referring to FIG. 4 a schematic diagram of a MZM modulator element 400 is depicted, according to one or more embodiments of optical modulators described herein. Depicted in FIG. 4, the MZM modulator element 400 comprises an optical input waveguide 404, an optical output waveguide 408 and first and second MZI arms 410, 412, each comprising optical semiconductor material. Each MZI arm interfaces with a radio frequency electrode that provides electro-optical modulation from the interaction of the electric field with the optical material. In various embodiments, in operation, light is input into the MZI modulator element 400 via the optical input waveguide 404. In such embodiments, input light can be initially split into two by an optical splitter 416 and respectively input to a first radio frequency electrode 420 and a second radio frequency electrode 424.

In one or more embodiments, first and second MZI arms 410, 412, each further interface with a heating element 426 configured to shift the optical phase of an optical signal traveling through the arm. In one or more embodiments, a DC voltage of $V_{bias}$ 428 is applied to the heater elements 426 to produce an optical phase shift. As such, various embodiments of the disclosure control the signal phase using a voltage adjustment applied to the heaters 426, rather than an adjustment applied to the RF electrodes. In such embodiments phase shift is linear with heater power (voltage squared), which we can compensate for by transforming our target phase according to the relationship: $V=V_0+\sqrt{\alpha\phi}$. In various embodiments, after the a phase differential is added by this optical phase shift, the outputs of the first and second RF electrodes 420 and 424 are multiplexed by a second coupler 430 and output, for example, as a DQPSK (differential quadrature phase-shifted keying) signal $P_{out}$ 432 via the optical output waveguide 408.

Based on the MZI (Mach-Zehnder Interferometer)-type structure of the optical intensity modulators the phase shift can correct for voltage bias drift. Due to the slower time scale of the voltage bias drift, the voltage bias correction can be performed using heating elements to shift the phase even though the heating elements have a slow response time relative to the RF electrode modulation.

In such embodiments the heating elements 426 are configured to operate according to a function that relatively changes the optical phase of input light. For example, in certain embodiments $V_{bias}$ 428 is applied to heating elements 426 to change the optical phase of input signals in accordance with logic or program instructions responding to a received data signal. In certain embodiments these data signals are NRZ (Non Return-to-Zero) signals. In some embodiments, the data signals are amplified data signals.

To calculate the voltage drift, an applied dither signal is delivered into the heaters 426 along with the bias voltage 428 in a form in which the dither signal can be distinguished from the data signal in the output optical signals. The output optical signal is measured with an optical tap that bleeds off a small part of the optical intensity. The tapped optical signal is measured with an optical detector, and the resulting electrical signal is processed as described herein.

Figure 5:
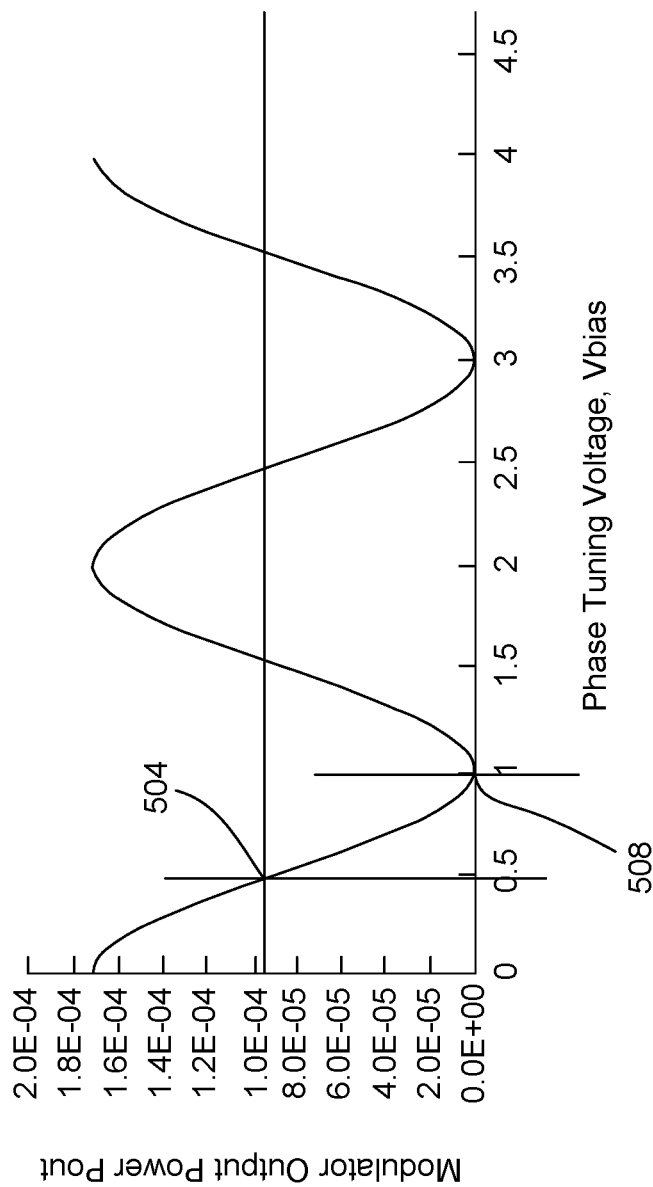
FIG. 5 is a plot of the output power of $P_{out}$ of the MZM modulator element of FIG. 4 as a function of $V_{bias}$, according to one or more embodiments.

FIG. 5 is a plot that shows schematically the output power of $P_{out}$ 432 of the MZM modulator element 400 in FIG. 1 as a function of $V_{bias}$ 428. As described above, during operations, the modulators bias operates at the desired bias conditions, with child MZM I and Q operating at Null bias and IQ parent MZM at quadrature bias. Auto bias control (ABC) is commonly used by adding dither signals to MZM bias and detected with tap monitor photo detector (mPD) followed by TIA and ADC. In various embodiments TIA will not be saturated in capture range and thus ABC can be turned on the loop to search and lock the MZM bias at required operating conditions, Null for child MZM and Quadrature for parent MZM, once the initial biases are set in the capture range. Depicted in FIG. 5, the quadrature bias 504 is achieved at a $V_{bias}$ 428 of approximately 0.5V while the null bias 508 is achieved at a $V_{bias}$ 428 of approximately 1V.

For a polarization multiplexed QAM modulator, modulator output power during ABS can be further increased. To reduce power change during ABS, photo detectors can be used for power monitor in polarization X (mPDX) and polarization Y (mPDY). The power in X and Y polarizations are used to search capture range as initial ABS. This will speed up ABS and allow some saturation at dither detection mPD during initial ABS.

Figure 6:
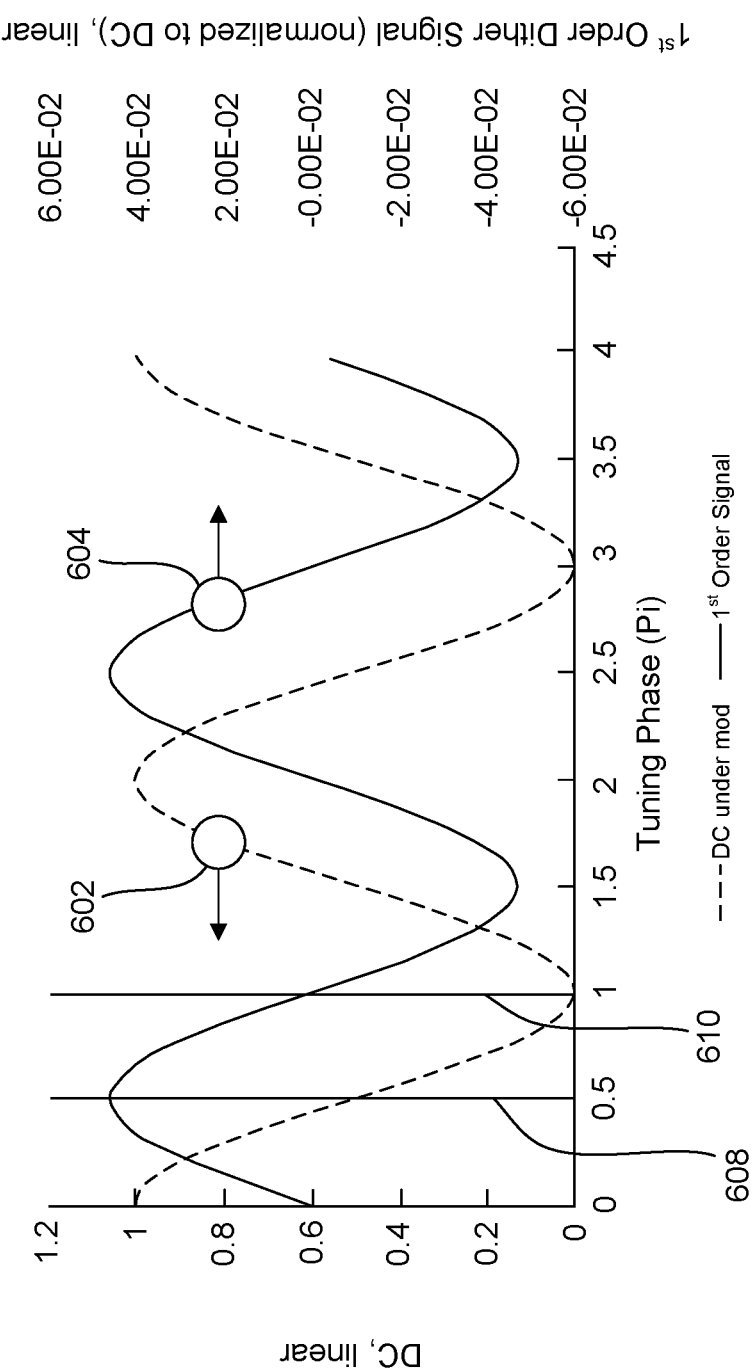
FIG. 6 is a plot of normalized modulator output power as a function of tuning phase for the $1^{st}$ order signal and DC level, according to one or more embodiments.

FIG. 6 is a plot that shows DC level 602 and the 1$^{st}$ order signal 604 as a function of the tuning phase. Depicted in FIG. 6, the 1$^{st}$ order dither signal 604 and DC level 602 are shown with operating conditions including null point 608 and quadrature point 610 for IQ parent MZM.

Figure 7:
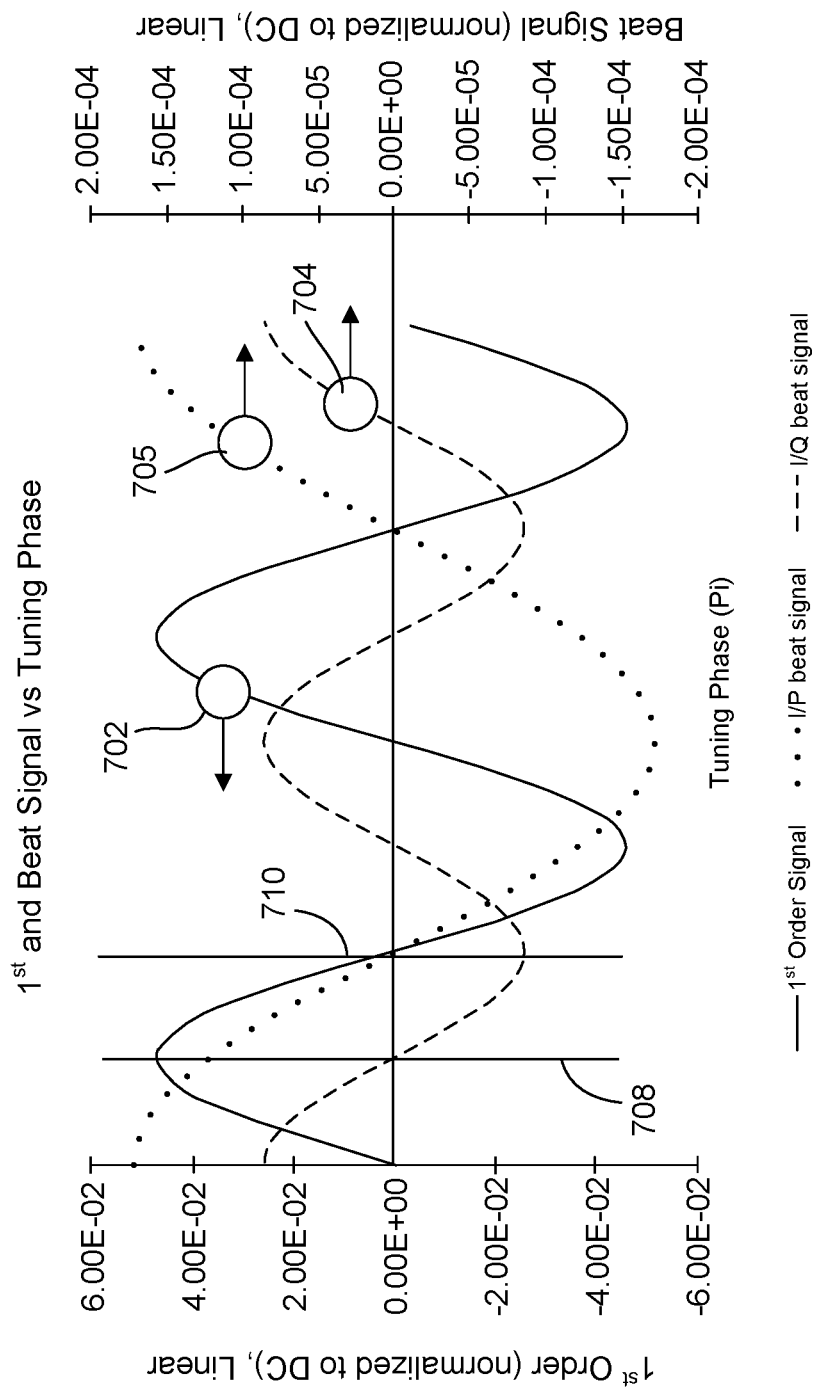
FIG. 7 is a plot of the $1^{st}$ order signal and Beat Signals of the MZM modulator element of FIG. 4 as a function of the tuning phase, according to one or more embodiments.

FIG. 7 is a pair of plots that show the 1$^{st}$ order signal 702 and beat signals 704, 705 of the MZM modulator element 400 in FIG. 4 as a function of the tuning phase. Depicted in FIG. 7, the 1$^{st}$ order dither signal 702 and beat signal 704 are shown with operating bias conditions in IQ modulator including null point 708 for child I and Q MZMs and quadrature point 710 for IQ parent MZM.

For high order QAM modulation, RF detection for IQ quadrature phase error is generally not effective anyone. The beat signal with sinusoidal dither, or sum of the first order dither signal with square wave like dither signals can be used. For example, the beat signal at f1+f1 and f1−f2 signals are generated when MZM I and Q are dithered by f1 and f2 signals, respectively. IQ MZM phase bias can be determined by these beat signal detections. FIG. 7 shows 1$^{st}$ order dither signal and beat signal vs tuning phase with operating bias conditions in IQ modulator, null points for child I and Q MZMs and quadrature point for IQ parent MZM. The detected beat signal can be several orders of magnitude lower than the first order dither signal, and this magnitude difference can result in an additional requirements for AC detection range for monitor of both first order and beat dither signals.

Herein, methods and apparatuses are described for modulator auto bias search (ABS) and auto bias control (ABC) for dither detections with a large dynamic range in both DC and AC detections. The disclosed methods and apparatuses describe hardware implementation and software algorithms to eliminate not only limitations of DC and AC dynamic ranges, but also the limitations of the resolutions and signal to noise ratio for dither signal detections for ABS and ABC.

Figure 8:
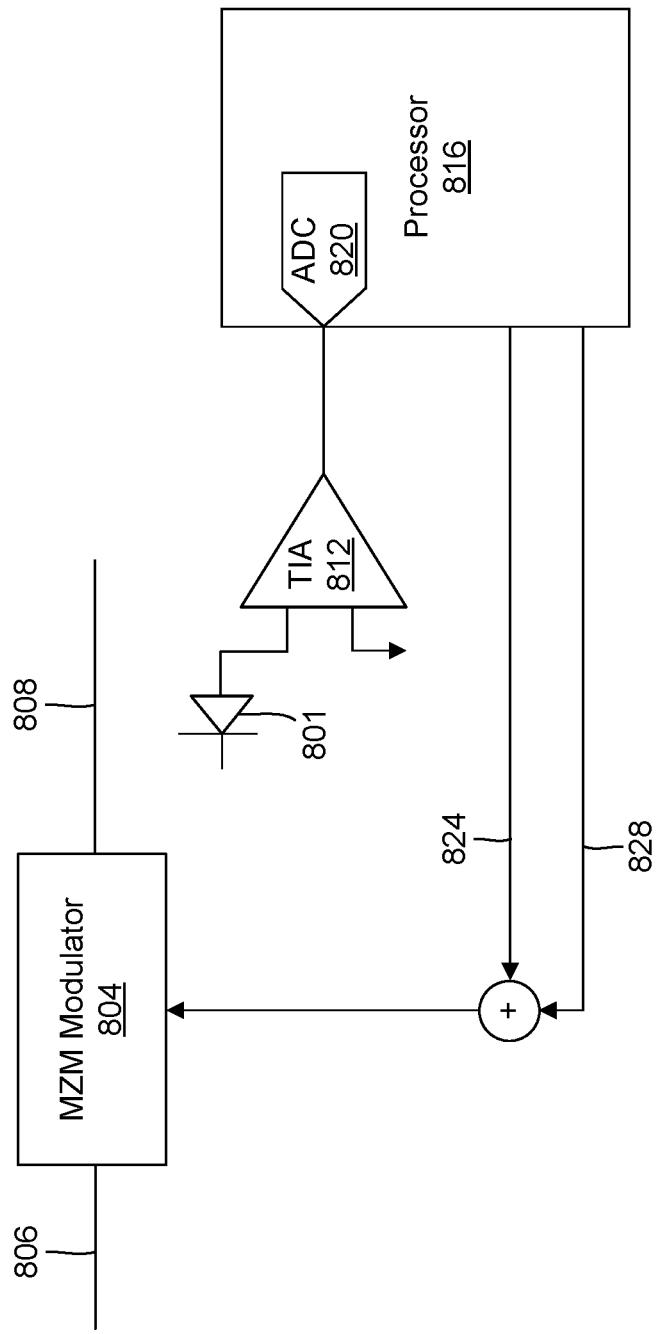
FIG. 8 depicts a block diagram of a dither signal detection system for a MZM modulator, in which transimpedance amplifier (TIA) signal is directed to an analog to digital converter for processing, according to one or more embodiments.

In some embodiments of dither detection, a monitor PD through tap coupler following TIA to convert photocurrent to voltage and then connect to high resolution ADC for dither detection including beat signal. FIG. 8 shows a schematic diagram of hardware components for dither detections that do not include some of the improvements to be discussed. Specifically, FIG. 8 depicts a block diagram of a dither signal detection for MZM ABC, in which transimpedance amplifier (TIA) signal is directed to an analog to digital converter for processing. In other words, a monitor photodiode or similar optical detector (PD) 801 obtains a sample optical signal through tap coupler followed by a TIA 812 to convert photocurrent to voltage and then connected to high resolution ADC 820 for dither detection including a beat signal. Depicted in FIG. 8, the block diagram includes a MZM modulator element 804 including an optical input waveguide 806 and optical output waveguide 808. In addition, the system includes a transimpedance amplifier (TIA) 812 that is configured to amply the photodetector signal from an optical tap that is used to measure an optical signal with a dither signal. In various embodiments the TIA 812 is coupled with a processor 816. The processor 816 includes an analog to digital converter (ADC) 820 connected to receive output from the TIA 812. The processor 816 is coupled with the MZM modulator 804 and is configured to provide a phase tuning voltage 824 and/or phase dither signal 828 to the MZM modulator 804.

If we assume the largest expected DC photo current is I_dc and the smallest expected dither detected signal is I_dither. TIA gain TG_tia to provide the TIA output voltage to be equal to the largest value of ADC input or full scale of ADC input, V_adc_max. Then the lowest resolution of ADC resolution, V_adc_min, is determined by the detected dither voltage V_dither. They can be expressed as below:

$$V\_adc\_max = TG\_tia \times I\_dc \quad \text{(II-1)}$$

$$V\_adc\_min = TG\_tia \times I\_dither \quad \text{(II-2)}$$

For N bit ADC, the resolution, $V\_adc\_min = V\_adc\_max/2^N$. From equations (1) and (2), the lowest expected dither current accuracy is:

$$I\_dither = I\_dc/2^N \quad \text{(II-3)}$$

For a dynamic range, D_dc can be expressed by $$D\_dc = I\_dc\_max/I\_dc\_min = I\_dither\_max/I\_dither\_min \quad \text{(II-4)}$$

Equations (1) and (2) can be expressed by:

$$V\_adc\_max = TG\_tia \times I\_dc\_max \quad \text{(II-5)}$$

$$V\_adc\_min = TG\_tia \times I\_dither\_min \quad \text{(II-6)}$$

The lowest expected detected dither signal, I_dither_min, can be expressed by $$I\_dither\_min = I\_dc\_max/2^N = I\_dc\_min \times D\_dc/2^N \quad \text{(II-7)}$$

Since the ratio of dither signal to DC is fixed as R_dithermin_dc=I_dither_min/I_dc_min, the dynamic range is determined by:

$$D\_dc = 2^N \times R\_dithermin\_dc \quad \text{(II-8)}$$

For 64QAM application, 2% dither amplitude with 1% dither accuracy is expected. The lowest detected dither signal is expected to be a beat signal with ratio to DC, R_dithermin_dc=0.00057. If 16 bit ADC, the dynamic range is 1.7 or 2.4 dB. This is far from sufficient to support multiple modulation format such as QPS/64QAM, which is requiring 10.5 dB to compensation modulation loss difference and 9 dB max power change during bias search as described as above.

The methods and apparatuses herein provide for modulator ABC to address the issues for a large modulator output dynamic range for extremely low dither detected signals. In some embodiments, we use TIA associated variable gain amplifier (VGA), with a DC block between TIA output and VGA input to eliminate the limitation. As with the other electrical components, DC blocks are commercially available components used for RF systems to reduce interference. TIA is used to convert photo current to DC voltage, while VGA is used as AC amplifier for dither amplification and connect to ADC. Furthermore, VGA is used to allow to provide a large dynamic range required by ABS and ABC operations.

Figure 9:
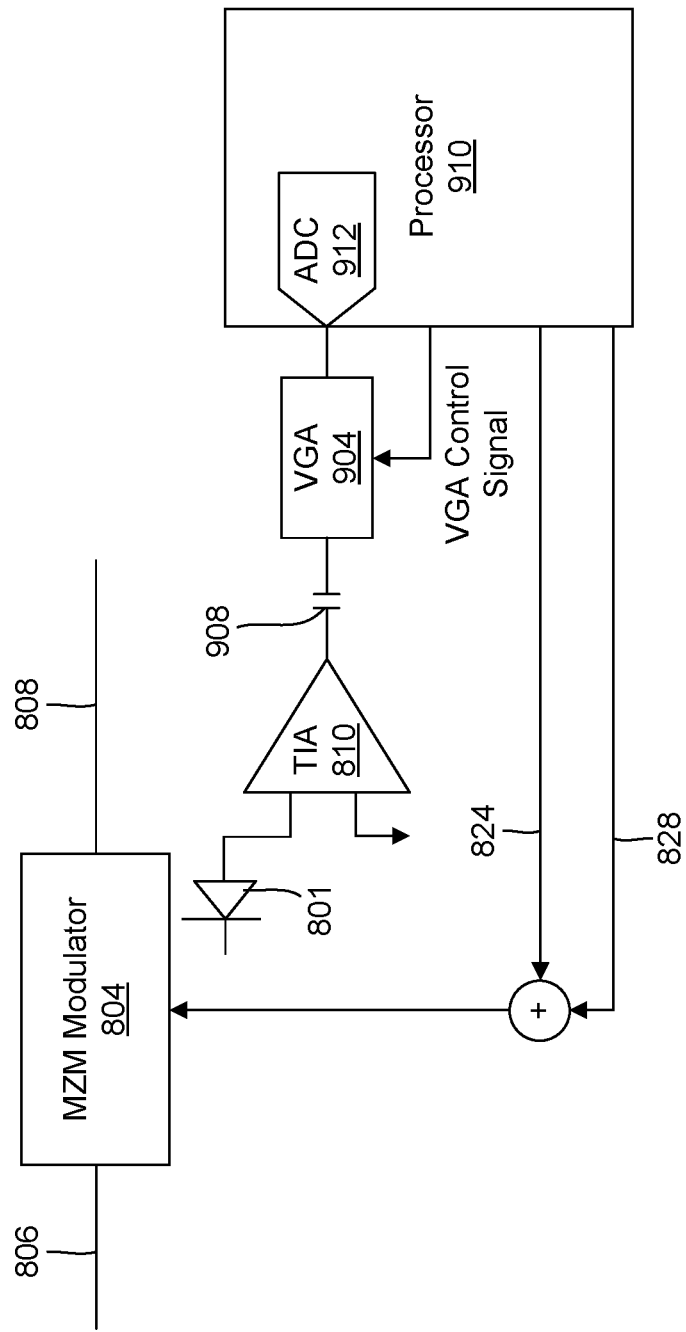
FIG. 9 depicts a block diagram for dither detection system with a DC blocker and a variable gain amplifier to provide a large dynamic range in both DC and AC, according to one or more embodiments.

For example, referring to FIG. 9 a function diagram is depicted for dither detection with a large dynamic range in both DC and AC, according to one or more embodiments. In various embodiments the system includes a MZM modulator element 804 having an optical input waveguide 806 and optical output waveguide 808. In addition, the system includes a transimpedance amplifier (TIA) 810 that is configured to provide a voltage based on the photodetector signal current from an optical tap 801 that is used to measure an optical signal with a dither signal. In one or more embodiments, the system additionally includes a variable gain amplifier (VGA) 904. In such embodiments the VGA 904 is connected to receive a signal from the TIA 810 via a DC blocker 908 for AC coupling between the TIA 810 and VGA 904. In addition, a processor 910 is coupled with the MZM modulator 804 and VGA 904. In one or more embodiments the processor includes an analog to digital converter (ADC) 912 and is connected to receive output from the VGA 904, although the ADC can be a separate component connected between the processor and the VGA. In embodiments shown in FIG. 9, the processor 910 is configured to control a modulator bias control system comprising an optical detector connected to a tap connected to the output waveguide, and an electrical connection to an electrode interfaced with at least one of the optical waveguide arms. In various embodiments, the processor 910 is configured to receive the signal from the ADC 912 and to output a bias tuning voltage based on evaluation of the received signal. In such embodiments, the VGA 904 and DC blocker 908 are configured to bring the signal received from the TIA 810 within a desirable range to allow for a more accurate measurement of the dither signal by the ADC 912 and processor 910. In one or more embodiments, the processor 910 is configured to calculate a dither signal based on the measurements of the optical detector and to generate the dither in a phase locked approach with the dither detection, and the modulator bias control system can have a dither output to a digital-to-analog converter that provides dither signals at two frequencies.

For polarization multiplexed QAM modulator, modulator output power during ABS can be further increased. To reduce power change during ABS, photo detectors can be used for power monitoring in polarization X (mPDX) and polarization Y (mPDY). The power in X and Y polarizations are used to search capture range as initial ABS. This approach can speed up ABS and allow some saturation at dither detection mPD during initial ABS.

Figure 10:
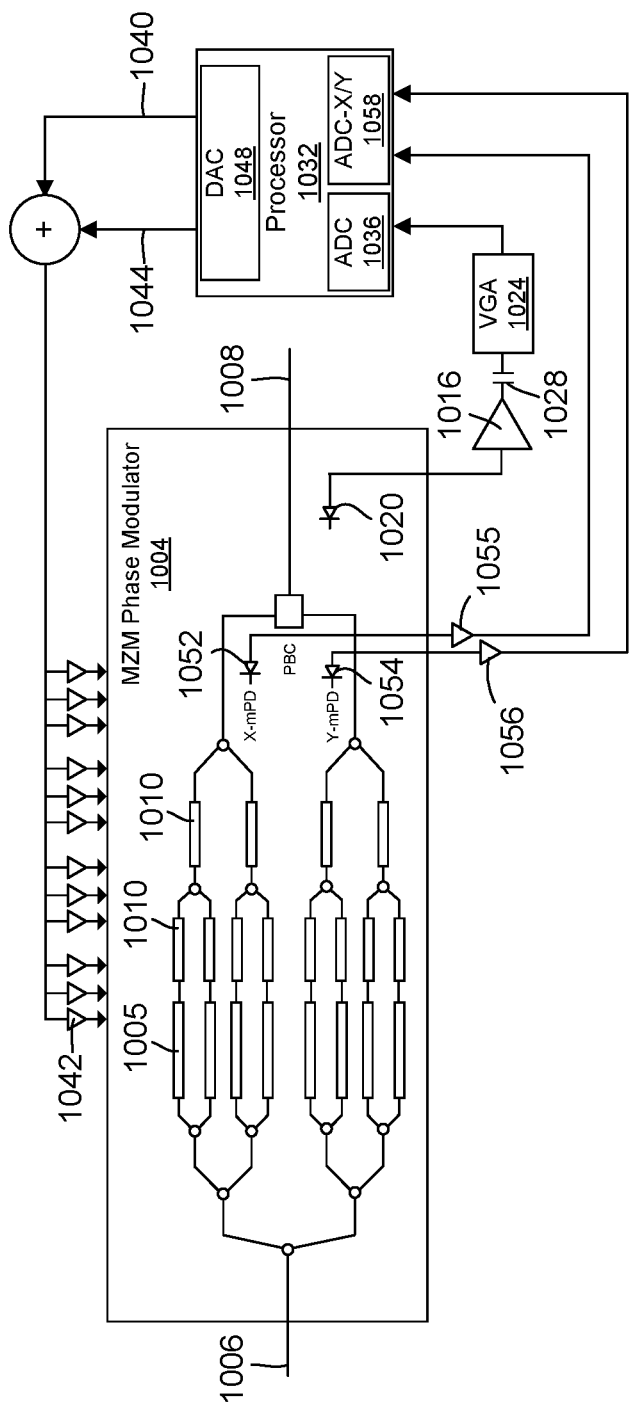
FIG. 10 depicts a block diagram for a coherent electro-optical modulator with dither detection combined with power monitor on polarization X and Y polarizations, according to one or more embodiments.

FIG. 10 shows the function diagram in this disclosure for dither detection combined with power monitor on polarization X and Y polarizations. In various embodiments the system includes a MZM modulator element 1004 having an optical input waveguide 1006 and optical output waveguide 1008. As described above, in various embodiments, the MZM modulator element 1004 includes a plurality of phase modulating portions defined by a plurality of MZI arms each comprising optical semiconductor material which split input light can via a corresponding optical splitter. As described, each MZI arm interfaces with a radio frequency electrode 1005 that provides electro-optical modulation from the interaction of the electric field with the optical material. In such embodiments, input light is respectively input to a corresponding phase modulating portion.

Similarly, in one or more embodiments, these phase modulating portions further comprise a plurality of heating elements 1010 that can shift the optical phase of an optical signal traveling through the arm. In one or more embodiments, DC voltages can be applied to the heater elements electrodes to produce an optical phase shift. Depicted in FIG. 10, each of the heating elements 1010 are individually connected with a processor that applies a bias voltage to one or more of the respective heater elements 1010 to individually modulate the phase of input light along each phase modulation portion. Based on the MZI (Mach-Zehnder Interferometer)-type structure of the optical intensity modulators the phase shift can correct for voltage bias drift in the RF electrodes. Due to the slower time scale of the voltage bias drift, the voltage bias correction can be performed using heating elements 1010 to shift the phase even though the heating elements have a slow response time relative to the RF electrode modulation. In various embodiments, after the a phase differential is added by this optical phase shift, the outputs of the first and second optical phase modulating portions are multiplexed by a second coupler and output via the optical output waveguide 1008.

To calculate the voltage drift, an applied dither signal 1040 is delivered from a processor 1032 or microcontroller unit into the RF electrodes 1005 along with the data signal in a form in which the dither signal 1040 can be distinguished from the data signal. The output optical signal is measured with an optical tap 1020 that bleeds off a small part of the optical intensity. The tapped optical signal is measured with an optical detector, and the resulting electrical signal is processed as described herein.

In addition to the above, the system includes a transimpediance amplifier (TIA) 1016 that is configured to amply the photodetector signal from the optical tap 1020 that is coupled with the MZM phase modulator 1004 and used to measure an optical signal with the dither signal. In one or more embodiments, the system additionally includes a variable gain amplifier (VGA) 1024. In such embodiments the VGA 1024 is connected to receive a signal from the TIA 1016 via a DC blocker 1028 for AC coupling between the TIA 1016 and VGA 1024. In addition, a processor 1032 is coupled with the MZM modulator 1004 and VGA 1024. In one or more embodiments the processor includes an analog to digital converter (ADC) 1036 and is connected to receive output from the VGA 1024.

In such embodiments, the processor 1032 is configured as part of a modulator bias control system comprising the optical detector connected to a tap 1020 connected to the output waveguide, and an electrical connection to one or more electrodes 1042 interfaced with the heating elements 1010 and RF electrodes 1005 of the optical waveguide arms.

As such, in various embodiments, the processor 1032 is configured to receive the signal from the ADC 1036 and to output a bias tuning voltage 1044 to the heating elements 1010 based on evaluation of the received signal. In such embodiments, the VGA 1024 and DC blocker 1028 are configured to bring the signal received from the TIA 1016 within a desirable range to allow for a more accurate measurement of the dither signal by the ADC 1036 and processor 1032. In one or more embodiments, the processor 1032 is configured to calculate a dither signal based on the measurements of the optical detector and to generate the dither in a phase locked approach with the dither detection. In various embodiments the modulator bias control system has a dither output to a digital-to-analog converter (DAC) 1048 that can provides dither signals at multiple frequencies. For example, in various embodiments the processor 1032 generates dithers at a variety of different frequencies or amplitudes by changing the range of the DAC outputs. Because our dither detection (ADC) is tightly phase locked to the dither generation (DAC), we are able to recover our error signal by simply multiplying each point of our buffer by a phase-locked reference signal. This provides better performance than, for example, using IIR (infinite impulse response) filters to recover the f1+f2 beat signal, as the phase is already known, and our reference signal can take account of f1+f2 and f1−f2.

In addition, as described above, to reduce power change during ABS, photo detectors 1052, 1054 can be used for power monitoring in polarization X (mPDX) and polarization Y (mPDY). In various embodiments, the photo detectors 1052, 1054, are each coupled with a TIA 1055, 1056 for converting the current generated by the photo detectors 1052, 1054 into a voltage that is used for signal processing by a second ADC 1058—allowing the processor 1032 to measure X and Y polarizations to search capture range as initial ABS. This approach can speed up ABS and allow some saturation at dither detection mPD during initial ABS.

This document discloses the hardware implementation and ABS and ABC operation algorithms as below.

In this disclosure, TIA trans-impedance gain TG_tia is designed to have no saturation voltage V_tia_max at max photo current at max output power, V_tia_max=TG_tia X I_dc_max. This design prevents the TIA output saturation to allow detect the dither signal which is AC signal. VGA gain range will be designed for dynamic range of dither signals during ABS and ABC operations. Since the largest first order dither signal, I_1stmax, is much higher than smallest detected beat signal, I_beat_min, the largest VGA gain can be determined by the largest first order dither signals to avoid the saturation at VGA output, which will be at quadrature point as shown in FIG. 1.

Assuming modulator output power have dynamic range, D_dc=I_dc_max/I_dc_min=I_dither_max/Idither_min, we can select TIA transimpedance gain TG_tia to have no saturation at TIA output at DC largest power as expressed by:

$$V\_tia\_max = I\_dc\_max \times TG\_tia \quad \text{(II-9)}$$

After TIA out, DC blocker blocks DC signal. Since the first dither signal is much higher than the beat signal, VGA gain is setting to have the no saturation at largest output equal full to scale of ADC input $$V\_vga\_max = I\_1stdither\_max \times TG\_tia \times G\_vga = V\_adc\_fs \quad (\text{II-10})$$

For any modulator output, VGA gain are set based on largest $1^{st}$ order signal as expressed in (10).

The smallest beat signal at VGA output can be expressed by:

$$V\_vga\_beat = I\_dither \times TG\_tia \times G\_vga \quad (\text{II-11})$$

Minimum beat signal resolution can be determined only by the ratio to the minimum beat signal to maximum $1^{st}$ order dither signal, R_beat_1stdither=I_beat/I_1stiterh_max, as expressed by:

$$V\_vga\_beat = R\_beat\_1stdithermax \times V\_adcfs \quad (\text{II-12})$$

For example, the ratio of maximum $1^{st}$ order signal to the beat signal, I_1stdither_max/I_beat_min, is 1750 for 64QAM modulated applications as shown in FIG. 7. 11 bit ADC can provide the resolutions of 1/2048, which is sufficient beat signal detection with VGA if maximum VGA output is the same as full scale of ADC input.

Furthermore, the $1^{st}$ order dither signals approaches to zero when child MZM approach to the operating points (null points), VGA gain can be further increase to improve the resolution of beat signal detections. With VGA gain dynamic change with $1^{st}$ order signal, this approach eliminates the limitation for minimum beat signal resolution due to maximum $1^{st}$ order signal and thus equation (12) can be expressed by:

$$V\_vga\_beat = R\_beat\_1stdither \times V\_adcfs \quad (\text{II-13})$$

In principle, the limitations due to DC power dynamic range are eliminated by the DC blocker, while AC (dither signals) dynamic range is guaranteed by VGA. With VGA gain dynamic change, the limitations for minimum beat signal resolution due to maximum $1^{st}$ order signal since the $1^{st}$ order signal is near zero when child MZM operating at the operating points (null points).

Figure 11:
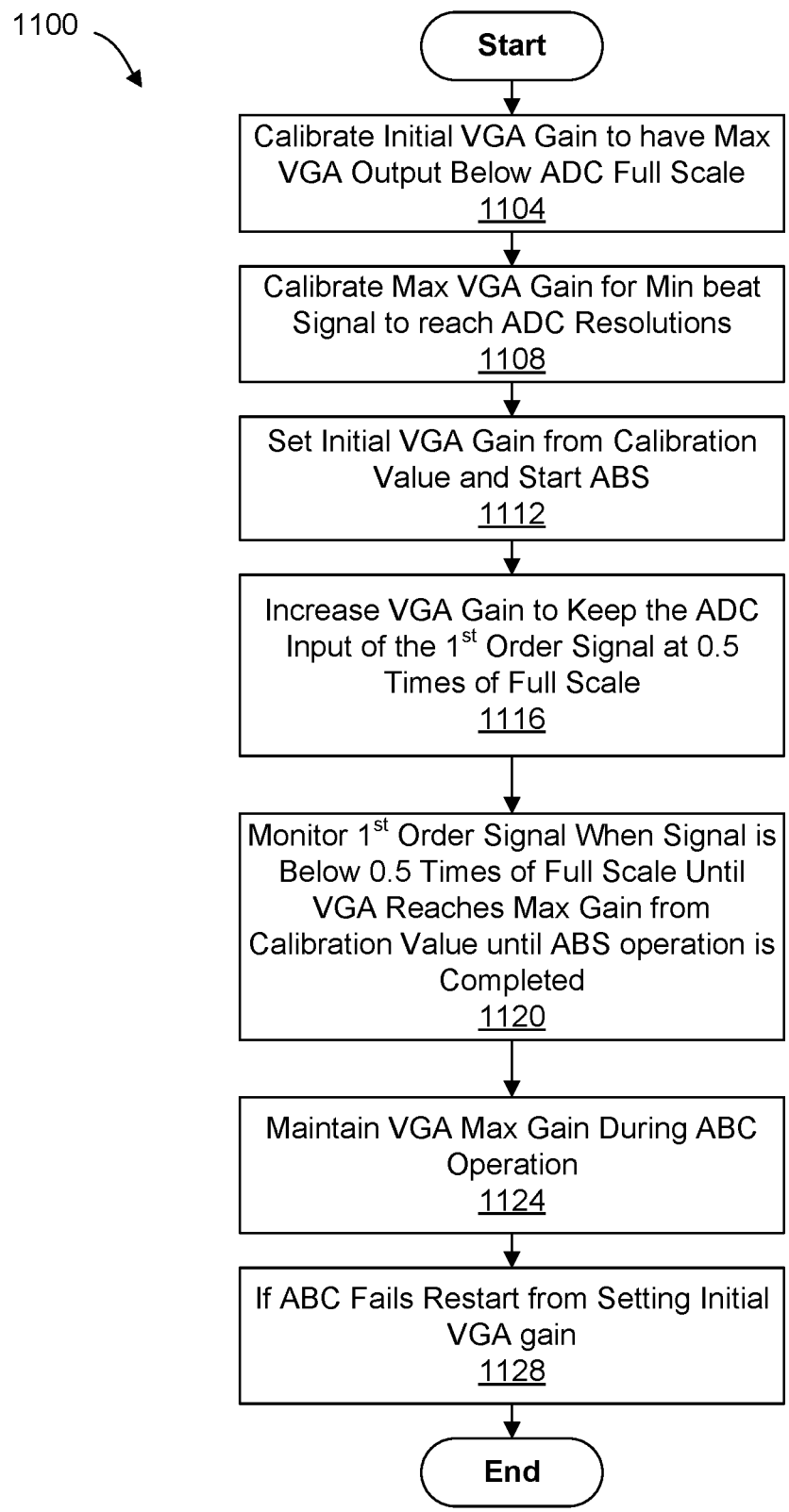
FIG. 11 depicts a flow diagram for a method of making dynamic gain adjustments to a variable gain amplifier for reducing beat signal resolution bias during automatic bias search and automatic bias control operations, according to one or more embodiments.

Referring to FIG. 11, a method 1100 of making dynamic gain adjustments to a variable gain amplifier for reducing beat signal resolution bias during automatic bias search and automatic bias control operations is depicted, according to one or more embodiments. As described above, in various embodiments the variable gain amplifier is configured to receive an AC signal following conversion of a detector signal from an optical tap on a Mach-Zehnder component of the electro-optical modulator to a voltage signal by a transimpedance amplifier and blockage of the DC component of the voltage signal. In such embodiments, the method 1100 presents a process for VGA dynamic gain change that eliminates the limitations of beat signal resolution.

In one or more embodiments, the method 1100 comprises, at operations 1104-1108, calibrating a variable gain amplifier to have a maximum variable gain amplifier output below an analog-to-digital-converter full scale monitor first order signal and calibrating a maximum gain of the variable gain amplifier to have a minimum beat signal that reaches a resolution requirement of the analog-to-digital-converter. In such embodiments, VGA_gain_ini is configured to have a maximum VGA output below ADC full scale. For example, in some embodiments, the maximum VGA output is configured to have around 80% of the ADC full scale when mPD receives maximum $1^{st}$ order dither signal. In one or more embodiments, this relationship is represented by the equation:

$$V\_vga\_fs \times 80\% = I\_1storder\_max \times TG\_gain \times VGA\_gain\_ini \quad (\text{II-14})$$

Similarly, in various embodiments I_beat_min, is configured to reach the ADC resolutions—represented by equation:

$$V\_vga\_res = I\_beat\_min \times TG\_gain \times VGA\_gain\_max \quad (\text{II-15})$$

In one or more embodiments, the method 1100 comprises, at operation 1112, setting an initial gain VGA_gain_ini for the variable gain amplifier based on the calibrated initial value and initiating an automatic bias search operation, wherein the calibrated initial value is set such that a maximum variable gain amplifier output is a selected fraction below an analog-to-digital-converter full scale monitor first order signal.

In one or more embodiments, the method 1100 comprises, at operation 1116, increasing the initial gain to keep an analog-to-digital-converter input of a first order dither signal at from about 0.45 to about 0.55 times the full scale monitor first order signal and, at operation 1120, monitoring the first order dither signal until the initial gain of the variable gain amplifier reaches the calibrated maximum variable gain amplifier output VGA_gain_max. In one or more embodiments, the method 1100 comprises, at operation 1124, maintaining the maximum variable gain amplifier output through a subsequent automatic bias control operation to have a lowest beat signal that reaches a resolution requirement of the analog-to-digital-converter. In various embodiments, the method 1100 comprises, at operation 1128, determining that the subsequent automatic bias control operation has failed and setting a second initial gain for the variable gain amplifier based on the calibrated value and initiating a second automatic bias search operation.

For ABS, the power changes at different bias condition and reaches to maximum when child MZM and parent MZM all reach the peak points. In polarization multiplexed QAM modulator, the modulator power increases by extra 3 dB. To avoid dither detection mPD saturated of maximum output power, a lower transimpedance gain is needed. However, the lower the transimpedance gain, the lower the detected beat signal at TIA output. The signal noise is common after TIA output without proper shielding. This may have impact on the minimum beat signal detections and thus the detection accuracy.

To increase signal to noise ratio at TIA output, it is useful to maintain the maximum dither generation, which is defined with the acceptable BER performance or OSNR penalty due to the dither. For nonlinear dither phase response such as heater, nonlinear compensations can be used.

Eventually the maximum TIA transimpedance gain is dependent on the saturation of TIA output. In order to maximize the signal to noise ratio, we propose a capture range in which TIA output is not saturated in the capture range and ABS and ABC can lock MZM bias at the required operating points when the bias are initial set in the capture range. Therefore, a high gain TIA transimpedance gain or high signal to noise ratio at TIA can be achieved. This approach involves an initial ABS to find the capture range.

In this disclosure, we use DC power monitor for polarization X and Y as initial ABS to search the capture range. The capture range is defined as phase power range in which the mPD DC detection has no DC saturation; but out of capture range, DC power may be saturated and thus there may be dither detection out of this range (dark range). The capture range can be defined as Pi phase shift range although other ranges are possible; but the range is defined to be wide to allow that the initial ABS can be easily completed by power monitor with mPDX and mPDY and also to allow that ABS and ABC can lock the bias to the operating points in the required timing. The wide range of capture range can allow low resolutions of mPDX and mPDY. For example, ⅙*Pi phase resolution is enough to search capture range with Pi phase. The capture range determines TIA transimpedance gain and thus min beat signal. For example, the beat signal can be 3 uV for Pi phase shift capture range, while it is 0.6 uV if the capture range is full range. Table 1 shows the calculations with the detected dither signals with Pi phase shift capture range and full phase capture range.

TABLE 1

| | min | typ | max | unit |
|---|---|---|---|---|
| a) Calculations for detected dither signal with Pi phase capture range mPD for 64QAM, 2% dither, 1% offset, w/ VGA, capture range of Pi phase | | | | |
| mPD input power in dB | −12.000 | −11.500 | −1.500 | dBm |
| mPD input powwr linear | 0.063 | 0.386 | 0.708 | mW |
| mPD resp (2%) | 0.014 | 0.020 | 0.025 | A/W |
| mPD in current | 0.001 | 0.008 | 0.018 | mA |
| TIA Resisitance | 114.000 | 114.000 | 114.000 | kOhm |
| TIA DC output | 100.701 | 857.013 | 2017.645 | mV |
| TIA Max 1st order signal ouput | 4.683 | 39.851 | 93.821 | mV |
| TIA Min 1st order signal ouput | 0.140 | 1.196 | 2.815 | mV |
| TIA Min beat signal output | 0.003 | 0.023 | 0.054 | mV |
| b) Calculations for detected dither signal with Pi phase capture range mPD for 64QAM, 2% dither, 1% offset, w/ VGA, capture range of full range | | | | |
| mPD input power in dB | −12.0000 | −11.5000 | 5.0000 | dBm |
| mPD input powwr linear | 0.0631 | 1.6127 | 3.1623 | mW |
| mPD resp | 0.0140 | 0.0195 | 0.0250 | A/W |
| mPD in current | 0.0009 | 0.0314 | 0.0791 | mA |
| TIA Resisitance | 26.0000 | 26.0000 | 26.0000 | kOhm |
| TIA DC output | 22.9668 | 817.6322 | 2055.4805 | mV |
| TIA Max 1st order signal ouput | 1.0680 | 38.0199 | 95.5798 | mV |
| TIA Min 1st order signal ouput | 0.0320 | 1.1406 | 2.8674 | mV |
| TIA Min beat signal output | 0.0006 | 0.0217 | 0.0547 | mV |

Figure 12:
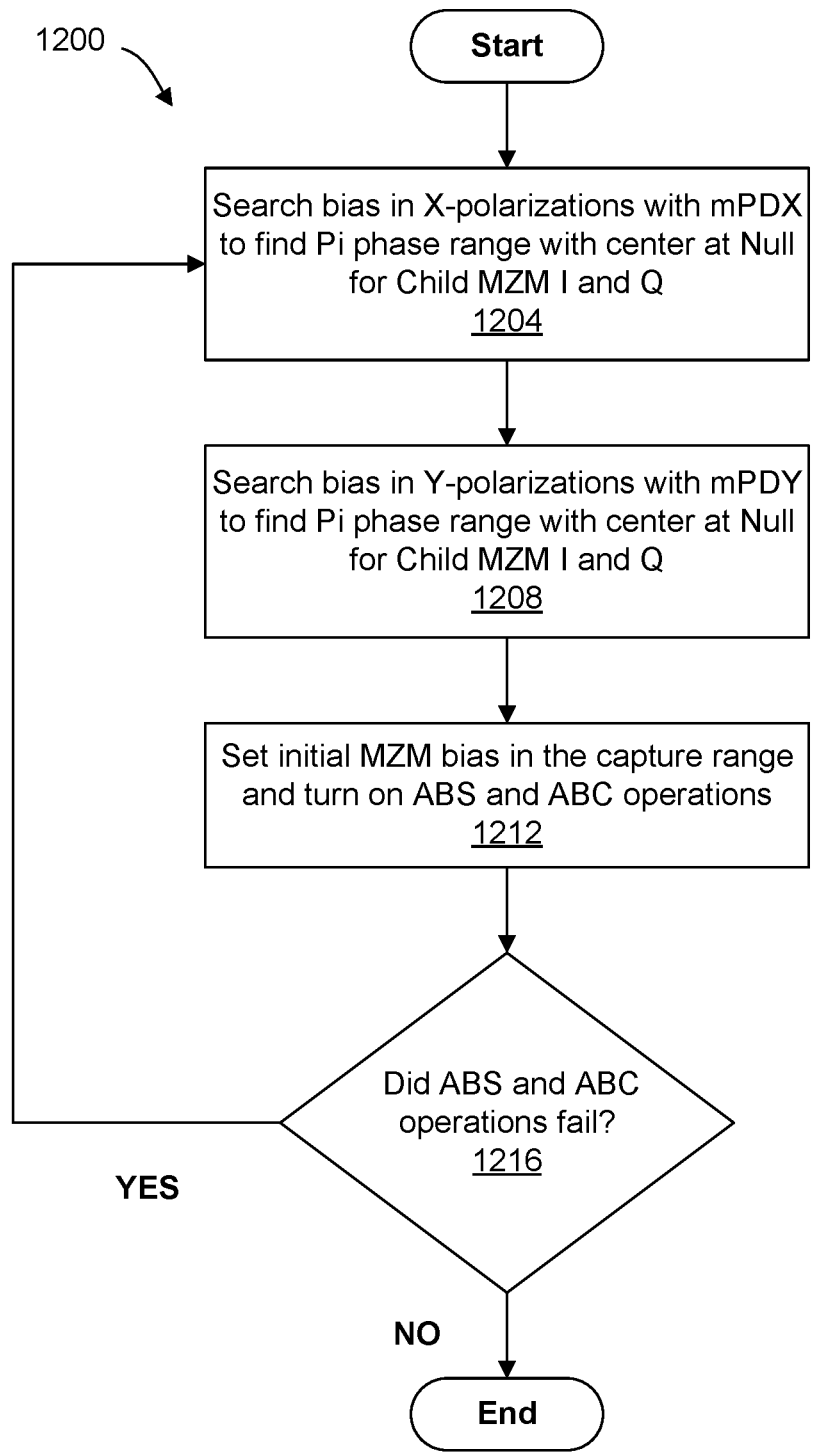
FIG. 12 depicts a flow diagram for a method for ABS and ABC operations incorporating initial ABS with power monitors for polarization X and Y, according to one or more embodiments.

Referring to FIG. 12, a method 1200 for ABS and ABC operations incorporating initial ABS with power monitors for polarization X and Y is depicted, according to one or more embodiments. In one or more embodiments, the method 1200 comprises, at operations 1204-1208, searching bias in X-polarizations with mPDX to find Pi phase range with center at Null for Child MZM I and Q and searching bias in Y-polarizations with mPDY to find Pi phase range with center at Null for Child MZM I and Q. In one or more embodiments, the method 1200 comprises, at operation 1212, setting the initial MZM bias in the capture range and initiating ABS and ABC operations. In various embodiments, at decision block 1216, the method 1200 comprises determining whether the ABS and/or ABC operation has failed and. In various embodiments, if the ABS and ABC operations fail, then the method 1200 resets to operation 1204. In one or more embodiments, if the ABS and ABC operations do not fail the method 1200 then terminates.

The capture range determines TIA transimpedance gain and thus minimum beat signal. Although full capture range can be achieved, Pi phase shift capture range dramatically reduces DC power range and thus allows increasing transimpedance gain to improve the signal to noise ratio for beat signal detection after TIA. For example, the beat signal can be 3 μV for Pi phase shift capture range, while it is 0.6 μV if the capture range is full range. Table 1 shows the calculations with the detected dither signals with Pi phase shift capture range a) and full phase capture range b).

Although the above algorithms are for Polarizations, they work for single polarization IQ modulators. In this application, a single mPD for power monitor is required.

In some embodiments, the systems and processes herein can be considered to have the following differentiations from other technologies The improved systems herein address issues for dither detection with extremely low dither signal and a large modulator output power range due to the following reasons:
1) Extremely low dither detected signals specified as high ratio of detected dither signal to DC power
2) Component loss variations
3) Different modulation format and spectral filter for flexible applications
4) Capable to search operating bias condition The improvements to address the issues for dither detection with extremely low dither signal and a large modulator output power range by the following solutions:
1) Eliminate limitations of DC and AC power dynamic range incorporating VGA functions
2) Eliminate the limitations of the resolutions for the beat signal detections with VGA dynamic gain control algorithms
3) Increase the beat signal level at TIA output and thus signal to noise ratio for beat detections by defining capture range
4) Incorporate initial ABS algorithms to speed up the bias search time by using DC power monitor.

In summary, the following concepts relate to improved dither detection embodiments as described herein.
1) Variable gain amplifier (VGA) with AC coupling following PD and TIA optical detections for dither detections to eliminate the limitations of large dynamic range of modulator optical DC output power and AC output power including the dither signals for coherent transceivers supporting multiple high order modulation format and various spectral filter.
2) Algorithms can incorporate VGA gain control and dither detections eliminate the limitations of the dither detection resolutions by maintaining optimum input range at input of ADC for dither detections with the required dither detection resolutions and dynamic range of modulator output power at different bias conditions and modulation format during calibrations, initial setting, ABS and ABC operating
3) TIA gain can be designed to achieve maximum signal-to-noise ratio for the operating bias conditions and to avoid saturations at some bias conditions such as max output power i.e. child and parent MZM operating at peak operation conditions for all polarizations.
4) A high TIA can be used to improve signal to noise ratio at TIA output which has capture range without saturation for ABS and ABC operations, but allows the saturations out of capture range.
5) A capture range without TIA output saturation is defined for the initial MZM bias setting for ABS and ABC operations.
6) TIA will not be saturated in capture range and thus ABS can be turned on the loop to search and lock the MZM bias at required operating conditions, Null for child MZM and Quadrature for parent MZM, once the initial biases are set in the capture range.

7) The capture range can be found by adding mPDX and mPDY in X- and Y-polarization MZM output with DC detections as initial ABS. The capture range search can be achieved to measure the MZM transfer functions by scanning MZM bias and monitoring mPDX and mPDY power in X- and Y-polarization independently with open control loop.

8) mPDX and mPDY can be low resolution DC power monitors for capture range search.

9) The method and apparatus can be used for various dither detections such as sinusoidal and square wave to Improve dither detection SNR in modulator output power dynamic range.

10) The initial ABS for capture range by using mPDX and mPDY can be completed by automation and integrated into ABS and ABC.

11) Maximum dither amplitude defined with acceptable dither performance penalty is used for dither generation.

12) The dither amplitude is maintained by compensation if the dither response is nonlinear.

13) The method and apparatus can be implemented in multiple MZM ABS and ABC methods with dither signals either different dither frequencies and or different timing with the sharing dither frequencies in time sharing.

14) The method and apparatus can be implemented any MZM applications with dither detections although the descriptions are for MZM with high order QAM modulation.

One or more embodiments may be a computer program product. The computer program product may include a computer readable storage medium (or media) including computer readable program instructions according to one or more of the embodiments described herein. The computer readable storage medium is a tangible device that can retain and store instructions for use by an instruction execution device. The computer readable storage medium may be, for example, an electronic storage device, a magnetic storage device, an optical storage device, or other suitable storage media. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Program instructions, as described herein, can be downloaded to respective computing/processing devices from a computer readable storage medium or to an external computer or external storage device via a network, for example, the Internet, a local area network, a wide area network and/or a wireless network. A network adapter card or network interface in each computing/processing device may receive computer readable program instructions from the network and forward the computer readable program instructions for storage in a computer readable storage medium within the respective computing/processing device.

Computer readable program instructions for carrying out one or more embodiments, as described herein, may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on a single computer, or partly on the single computer and partly on a remote computer. In some embodiments, the computer readable program instructions may execute entirely on the remote computer. In the latter scenario, the remote computer may be connected to the single computer through any type of network, including a local area network (LAN) or a wide area network (WAN), or public network. One or more embodiments are described herein with reference to a flowchart illustrations and/or block diagrams of methods, systems, and computer program products for enhancing target intercept according to one or more of the embodiments described herein. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some embodiments, the functions noted in the block may occur out of the order noted in the figures. For example, two blocks shown in succession may, in fact, be executed substantially concurrently, or the blocks may sometimes be executed in the reverse order, depending upon the functionality involved. In one or more embodiments, the program instructions of the computer program product are configured as an "App" or application executable on a laptop or handheld computer utilizing a general-purpose or special-purpose operating system.

The invention further relates to the following Inventive Concepts.

1. A method of dynamic gain adjustments to a variable gain amplifier for reducing beat signal resolution bias during automatic bias search and automatic bias control operations, where the variable gain amplifier is configured to receive an AC signal following conversion of a detector signal from an optical tap on a Mach-Zehnder component of the electro-optical modulator to a voltage signal by a transimpedance amplifier and blockage of the DC component of the voltage signal, the method comprising:

setting an initial gain for the variable gain amplifier based on a calibrated initial value and initiating an automatic bias search operation, wherein the calibrated initial value is set such that a maximum variable gain amplifier output is a selected fraction below an analog-to-digital-converter full scale monitor first order signal;

increasing the initial gain to keep an analog-to-digital-converter input of a first order dither signal at from about 0.45 to about 0.55 times the full scale monitor first order signal;

monitoring the first order dither signal until the initial gain of the variable gain amplifier reaches the calibrated maximum variable gain amplifier output; and maintaining the maximum variable gain amplifier output through a subsequent automatic bias control operation to have a lowest beat signal that reaches a resolution requirement of the analog-to-digital-converter.

2. The method of Inventive Concept 1 further comprising:
determining that the subsequent automatic bias control operation has failed; and
setting a second initial gain for the variable gain amplifier based on the calibrated value and initiating a second automatic bias search operation.

3. A computer program product for dynamic gain adjustments to a variable gain amplifier for reducing beat signal resolution bias during automatic bias search and automatic bias control operations, where the variable gain amplifier is configured to receive an AC signal following conversion of a detector signal from an optical tap on a Mach-Zehnder component of the electro-optical modulator to a voltage signal by a transimpedance amplifier and blockage of the DC component of the voltage signal, the computer program product comprising:

a computer readable storage medium having program instructions embodied therewith, wherein the computer readable storage medium is not a transitory signal, the program instructions executable by a processor, the program instructions comprising:

instruction means to set an initial gain for the variable gain amplifier based on a calibrated initial value and initiating an automatic bias search operation, wherein the calibrated initial value is set such that a maximum variable gain amplifier output is a selected fraction below an analog-to-digital-converter full scale monitor first order signal;

instruction means to increase the initial gain to keep an analog-to-digital-converter input of a first order dither signal at from about 0.45 to about 0.55 times the full scale monitor first order signal;

instruction means to monitor the first order dither signal until the initial gain of the variable gain amplifier reaches the calibrated maximum variable gain amplifier output; and instruction means to maintain the maximum variable gain amplifier output through a subsequent automatic bias control operation to have a lowest beat signal that reaches a resolution requirement of the analog-to-digital-converter.

4. The computer program product of Inventive Concept 3 wherein the program instructions further comprise:
instruction means to determine that the subsequent automatic bias control operation has failed; and
instruction means to set a second initial gain for the variable gain amplifier based on the calibrated value and initiating a second automatic bias search operation.

5. A method for applying a superimposed reference signal to an RF electrode within an electro-optical modulator comprising semiconductor waveguides in a Mach-Zehnder configuration: the method comprising:
applying two oscillating voltages added to a signal modulation, each oscillating voltage being applied according to the formula, $f_\alpha(\varphi)=(1-)1-\sin(\varphi))^\alpha)\hat{}(-1+(1-\sin(\varphi+\pi))^\alpha)$, where $\alpha$ is a parameter controlling the anharmonic character with $\alpha \geq 1.1$.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated

What is claimed is:

1. A dither detection system for an electro-optical modulator, the dither detection system comprising:
a variable gain amplifier (VGA) with AC coupling connected to receive a signal from a transimpedance amplifier (TIA) that is configured to amply the photodetector signal from an optical tap that is used to measure an optical signal with a dither signal;
an analog to digital converter (ADC) connected to receive output from the VGA; and
a processor connected to receive the signal from the ADC and to output a bias tuning voltage based on evaluation of the signal from the tap.

2. The dither detection system of claim 1 further comprising a DC blocker configured to receive output from the TIA and transmit the AC signal to the VGA.

3. The dither detection system of claim 1 further comprising an electro-optical modulator comprising RF electrodes interfaced with semi-conductor waveguides on the arms of Mach-Zehnder interferometers, wherein the processor is connected to output the bias tuning voltage to the electro-optical modulator for controlling optical modulation.

4. The dither detection system of claim 3 wherein the electro-optical modulator includes phase heaters interfaced with the semi-conductor waveguides and connected to receive the output bias tuning voltage for controlling phase modulation using heat.

5. The dither detection system of claim 4 wherein the output voltage to the heaters is scaled by the square root of a target phase shift calculated by the processor based on the signal from the ADC.

6. The dither detection system of claim 4 wherein the processor is connected to output the dither signal for measurement by the optical tap along with the bias tuning voltage.

7. The dither detection system of claim 1 wherein the VGA is configured to have a maximum VGA output that is below the full scale of the ADC.

8. The dither detection system of claim 1 wherein the VGA is configured to have a maximum VGA output around 80% of the full scale of the ADC full scale.

9. The dither detection system of claim 1 wherein the dither signal includes a first dither signal having a first dither frequency is 5 kHz and a second dither signal having a second dither frequency is 3.33 kHz, and wherein the number of points is 48.

10. The dither detection system of claim 1 wherein the bias tuning voltage is a fundamental voltage bias, and wherein a first dither value is used.

11. The dither detection system of claim 1 wherein the bias tuning voltage is a fundamental voltage bias, and wherein a first dither value and a second dither value are both used.

* * * * *